(12) United States Patent
Takeshita et al.

(10) Patent No.: US 7,184,512 B2
(45) Date of Patent: Feb. 27, 2007

(54) PHASE LOCKED LOOP CIRCUIT AND OPTICAL COMMUNICATIONS RECEIVING APPARATUS

(75) Inventors: Toru Takeshita, Kanagawa (JP); Takashi Nishimura, Kanagawa (JP)

(73) Assignee: Sony Corporation (JP)

( * ) Notice: Subject to any disclaimer, the term of this patent is extended or adjusted under 35 U.S.C. 154(b) by 783 days.

(21) Appl. No.: 10/352,162

(22) Filed: Jan. 28, 2003

(65) Prior Publication Data
US 2003/0142775 A1 Jul. 31, 2003

(30) Foreign Application Priority Data
Jan. 31, 2002 (JP) ............................. P2002-022736

(51) Int. Cl.
*H03D 3/24* (2006.01)
(52) U.S. Cl. ................... 375/375; 375/376; 327/147; 327/156; 331/11; 398/150
(58) Field of Classification Search ................ 375/375, 375/376, 294; 327/147, 156; 331/11; 398/188, 398/150
See application file for complete search history.

(56) References Cited

U.S. PATENT DOCUMENTS

| | | | | |
|---|---|---|---|---|
| 4,773,085 A | * | 9/1988 | Cordell | 375/375 |
| 6,545,546 B2 | * | 4/2003 | Takeshita et al. | 331/11 |
| 6,915,081 B2 | * | 7/2005 | Takeshita et al. | 398/188 |
| 2005/0058235 A1 | * | 3/2005 | Beeson et al. | 375/376 |

* cited by examiner

*Primary Examiner*—Temesghen Ghebretinsae
(74) *Attorney, Agent, or Firm*—Rader Fishman Grauer PLLC; Ronald P. Kananen

(57) ABSTRACT

A clock generator is configured to generate, on the basis of an oscillation frequency clock of a voltage-controlled oscillator, a first signal having a phase the same as the oscillation frequency clock, a second signal having a phase delayed by a first phase amount to the first signal and a third signal having a phase delayed by a second phase amount to the first signal. A phase detection circuit is configured to provide a phase control on the basis of a phase difference between the third signal and an input signal. A frequency detection circuit is configured to sample the first and second signals synchronously with the input signal, thereby performing a frequency control for the voltage-controlled oscillator on the basis of the sampled signals.

24 Claims, 18 Drawing Sheets

US 7,184,512 B2

PHASE LOCKED LOOP CIRCUIT AND OPTICAL COMMUNICATIONS RECEIVING APPARATUS

CROSS REFERENCE TO RELATED APPLICATIONS

This application claims priority from Japanese Priority Document No. P2002-022736, filed on Jan. 31, 2002 with the Japanese Patent Office, which document is hereby incorporated by reference.

BACKGROUND OF THE INVENTION

1. Field of the Invention

This invention relates to a phase locked loop (hereinafter referred to as PLL) circuit and an optical communications receiving apparatus, and more particularly, to a PLL circuit having a phase detection circuit and a frequency detection circuit, and an optical communications receiving apparatus employing such PLL circuit as a generation circuit of a clock signal required for a re-timing processing upon receiving data.

2. Description of the Related Art

FIG. 14 shows a configuration of a conventional PLL circuit generally available at the present. The PLL circuit shown in FIG. 14 has a phase detection (PD) circuit 101 and a frequency detection (FD) circuit 102, and is operated as follows.

First, a frequency comparison of an input signal DATA with each clock signal (ICLK, QCLK) is executed in the frequency detection circuit 102. Then, based on a result of the above mentioned frequency comparison, a frequency of an oscillation frequency clock VCOCLK of a voltage-controlled oscillator (hereinafter referred to as VCO) 106 is pulled into an objective oscillation frequency by controlling the frequency of the oscillation frequency clock VCOCLK through a charge pump (CP) circuit 104 and a loop filter 105. In addition, the clock signals (ICLK, QCLK) are generated in a clock generator 107 on the basis of the oscillation frequency clock VCOCLK of the VCO 106.

Subsequently, a phase comparison of the input signal DATA with the oscillation frequency clock VCOCLK of the VCO 106 is executed in the phase detection circuit 101. Then, based on a result of the above mentioned phase comparison, the phase of the oscillation frequency clock VCOCLK of the VCO 106 is coincided with the phase of the input signal DATA by controlling the phase of the oscillation frequency clock VCOCLK of the VCO 106 through a charge pump circuit 103 and the loop filter 105.

In the PLL circuit of this kind, a circuit having a configuration as shown in FIG. 15 has been conventionally used as the frequency detection circuit 102. A specific circuit configuration of the frequency detection circuit 102 shown in FIG. 15 and the operation thereof will be now described.

In the PLL circuit shown in FIG. 15, assume that a digital signal DATA having non-return-to-zero (hereinafter referred to as NRZ) waveform is to be supplied to the frequency detection circuit 102. It is also assumed that the clock generator 107 provides the clock signal ICLK obtained by dividing the oscillation frequency clock VCOCLK of the VCO 106 at a predetermined dividing ratio 1/n (n=1 in this case), and also provides the clock signal QCLK obtained by shifting a phase of the clock signal ICLK by 90 degrees, and these clock signals ICLK and QCLK are to be supplied to the frequency detection circuit 102.

A data input terminal 111 to which the input signal DATA of the NRZ waveform is supplied is connected to a data input terminal (hereinafter referred to as D input terminal) of a D type flip-flop (hereinafter referred to as D-FF) 112, and also connected to one input terminal A of an exclusive-OR (hereinafter referred to as EX-OR) gate 113. On the one hand, an ICLK input terminal 114 to which the clock signal ICLK is supplied is connected to one input terminal A of each AND gate 116 and 117, and a QCLK input terminal 115 to which the clock signal QCLK is supplied is connected to the other input terminal B of each AND gate 116 and 117. In this case, the one input terminal A of the AND gate 117 is an inverting input terminal to which the clock signal ICLK with an inverted polarity thereof is supplied.

Respective output terminals of the AND gates 116 and 117 are connected to respective D input terminals of D-FFs 118 and 119. An output terminal of the EX-OR gate 113 is connected to a clock input terminal (hereinafter referred to as CLK input terminal) of each of the D-FFs 118 and 119. Respective Q output terminals of the D-FFs 118 and 119 are connected to respective D input terminals of D-FFs 120 and 121, and respective Q output terminals of the D-FF 120 and D-FF 121 are connected to respective D input terminals of D-FF 122 and D-FF 123. In addition, respective CLK terminals of the D-FFs 112 and 120 to 123 are connected to the ICLK input terminal 114.

A Q output terminal of the D-FF 122 is connected to one input terminal A of an AND gate 124. A Q output terminal of the D-FF 123 is connected to the other input terminal B of an AND gate 125. The Q output terminal of the D-FF 120 is further connected to one input terminal A of the AND gate 125, and the Q output terminal of the D-FF 121 is further connected to the other input terminal B of the AND gate 124. In addition, output terminals of each of the AND gates 124 and 125 are connected to circuit output terminals 126 and 127.

Further, a DOWN pulse signal that controls the oscillation frequency of the VCO 106 in FIG. 14 so as to set the oscillation frequency thereof lower is derived from the AND gate 124 as an output signal thereof. In addition, an UP pulse signal that controls the oscillation frequency of the VCO 106 so as to set the oscillation frequency thereof higher is derived from the AND gate 125 as an output signal thereof. Then, the DOWN pulse signal and the UP pulse signal are supplied to the charge pump circuit 104 in FIG. 14 through the circuit output terminals 126 and 127.

A circuit operation of the frequency detection circuit 102 having the above configuration will be now described with reference to a timing chart depicted in FIG. 16. Incidentally, reference codes (a) to (o) in the timing chart of FIG. 16 respectively represent waveforms as those of nodes shown by reference codes (a) to (o) in FIG. 15.

A clock signal ICLK (a) is a signal of a pulse waveform, which rises to a high level (hereinafter referred to as "H" level) at a point of a time t0, and falls to a low level (hereinafter referred to as "L" level) at a point of a time t2. In the following, the clock signal ICLK (a) also rises to the "H" level at points of time t4, t8, t12, ... and falls to the "L" level at points of time t6, t10, ... likewise. The clock signal ICLK (a) is supplied to the one input terminal A of each of the AND gates 116 and 117 through the ICLK input terminal 114 and also to the CLK terminal of each of the D-FFs 112 and 120 to 123.

A clock signal QCLK (b) is a signal of a pulse waveform whose phase is shifted, specifically, delayed by 90 degrees to the clock signal ICLK (a). In other words, the clock signal QCLK (b) rises to the "H" level at the points of time t1, t5, t9, . . . and falls to the "L" level at the points of time t3, t7, t11, . . . . The clock signal QCLK (b) is supplied to the other input terminal B of each of the AND gates 116 and 117 through the QCLK input terminal 115.

The AND gate 116 is supposed to generate a logical product of the clock signals ICLK (a) and QCLK (b), so that an output signal (c) of the AND gate 116 becomes "H" as long as both the clock signals ICLK (a) and QCLK (b) are of the "H" level, in other words, in a period between the points of time t1 and t2, a period between the points of time t5 and t6, and a period between the points of time t9 and t10. On the contrary, the output signal (c) thereof is supposed to become "L" in the other periods such as a period between the points of time t0 and t1, a period between the points of time t2 and t5, a period between the points of time t6 and t9, and a period between the points of time t10 and t12.

On the other hand, the AND gate 117 is supposed to generate a logical product of an inverted clock signal ICLKX of the clock signal ICLK (a) and the clock signal QCLK (b), so that an output signal (d) of the AND gate 117 becomes "H" as long as both the clock signals ICLKX and QCLK (b) are at the "H" level, in other words, in the period between the points of time t2 and t3, the period between the points of time t6 and t7 and the period between the points of time t10 and t11. On the contrary, the output signal (d) thereof is supposed to become "L" in the other periods such as a period between the points of time t0 and t2, a period between the points of time t3 and t6, a period between the points of time t7 and t10, and a period on and after the point of time t11.

In the timing chart of FIG. 16, a "H" level period of the output signal (c) is represented as a period A, and a "H" level period of the output signal (d) is represented as a period B.

On the one hand, an input signal DATA (f) of an NRZ waveform provided to the data input terminal 111 is directly supplied to one input terminal A of the EX-OR gate 113 and also to the D input terminal of the D-FF 112. The D-FF 112 samples, at the point of time on the leading edge of the clock signal ICLK, a "H" level or a "L" level value of the input waveform supplied to the D input terminal thereof. In this case, if the input signal DATA (f) is supposed to be at the "H" level at the point of time t0, by sampling a "H" level value of the input signal DATA (f), a Q output signal (e) of the D-FF 112 becomes "H".

In addition, the input signal DATA (f) is varied between the points of time t1 and t2 to invert the polarity, so that a "L" level value of the "L" level input signal DATA (f) is sampled at the point of time t4 on the next leading edge of the clock signal ICLK (a), thereby the Q output signal (e) of the D-FF 112 makes the transition from the "H" level to the "L"°level. Furthermore, an inverting of the polarity of the input signal DATA (f) occurs again between the points of time t6 and t7, so that the "H" level value of the "H" level input signal DATA (f) is sampled at the point of time t8 on the next leading edge of the clock signal ICLK (a), thereby the Q output signal (e) of the D-FF 112 makes the transition from the "L" level to the "H" level. Thereafter, the Q output signal (e) maintains the "H" level up to the point of time t12.

The Q output signal (e) of the D-FF 112 is supplied to the other input terminal B of the EX-OR gate 113, and an exclusive logical sum operation of the Q output signal (e) with the input signal DATA (f) supplied to one input terminal A of the EX-OR gate 113 is executed in the EX-OR gate 113. As a result, an output signal (g) of the EX-OR gate 113 makes the transition from the "L" level to the "H" level at the point of time when the inverting of the input signal DATA (f) is supposed to occur between the points of time t1 and t2 and, on the contrary, from the "H" level to the "L" level at the point of time t4 when the Q output signal (e) of the D-FF 112 is supposed to make the transition from the "H" level to the "L" level, as clearly shown in the timing chart of FIG. 16.

The output signal (g) of the EX-OR gate 113 maintains the "L" level in the period between the point of time t4 and the point of time at which the inverting of the input signal DATA (f) is supposed to occur again. When the inverting of the input signal DATA (f) occurs again between the points of time t6 and t7, the output signal (g) of the EX-OR gate 113 makes the transition from the "L" level to the "H" level at the point of time of the inverting thereof.

Subsequently, when the point of time t8 comes, the Q output signal (e) of the D-FF 112 is supposed to make the transition from the "L" level to the "H" level, so that the exclusive logical sum operation of the "H" level value of the input signal DATA (f) with the "H" level value of the Q output signal (e) is executed, thereby the output signal (g) of the EX-OR gate 113 makes the transition from the "H" level to the "L" level. Then, the level of the output signal (g) of the EX-OR gate 113 remains unchanged in the subsequent period between the points of time t8 and t12.

The output signals (c) and (d) of the AND gates 116 and 117 are respectively supplied to the D input terminals of the next-stage D-FFs 118 and 119. The D-FFs 118 and 119 are configured to allow the output signal (g) of the EX-OR gate 113 to enter as CLK inputs and thus sample, at the point of the leading edge of the clock waveform of the output signal (g), the waveforms supplied to the D input terminal thereof, thereby deriving the levels thereof as Q output signals (h) and (k).

In this case, the output signal (g) of the EX-OR gate 113 is raised in the period between the points of time t1 and t2, and the output signal (c) of the AND gate 116 and the output signal (d) of the AND gate 117 are respectively at the "H" level and the "L" level in this period, so that the output signal (h) of the D-FF 118 and the Q output signal (k) of the D-FF 119 respectively become "H" and "L".

A change point of the input signal DATA (f) in the period between the points of time t6 and t7 is the point of time at which the output signal (g) of the EX-OR 113 is supposed to make the next transition from the "L" level to the "H" level. The output signal (c) of the AND gate 116 and the output signal (d) of the AND gate 117 at this point of time are respectively at the "L" level and the "H" level, so that the Q output signal (h) of the D-FF 118 and the output signal (k) of the D-FF 119 respectively make the transition from the "H" level to the "L" level and from the "L" level to the "H" level, and thereafter, maintain the "L" level and the "H" level up to the point of time t12.

The Q output signals (h) and (k) of the D-FFs 118 and 119 are respectively supplied to the D input terminals of the D-FFs 120 and 121. The D-FFs 120 and 121 are configured to allow the clock signal ICLK (a) to enter as CLK input and thus sample, at the point of time on the leading edge of the waveform of the clock signal ICLK (a), the waveforms supplied to the D input terminals thereof. In this case, the time t4 is the point of time on the next leading edge of the clock signal ICLK (a), and the Q output signal (h) of the D-FF 118 and the Q output signal (k) of the D-FF 119 at this point of time are respectively at the "H" level and the "L" level, so that a Q output signal (i) of the D-FF 120 and a Q output signal (l) of the D-FF 121 respectively become "H" and "L".

The time t8 is the point of time on the next leading edge of the clock signal ICLK (a), and the Q output signal (h) of the D-FF 118 and the Q output signal (k) of the D-FF 119 at this point of time are respectively at the "L" level and the "H" level, so that the Q output signal (i) of the D-FF 120 and the Q output signal (l) of the D-FF 121 respectively make the transition from the "H" level to the "L" level and from the "L" level to the "H" level and thereafter, maintain the "L" level and the "H" level up to the point of time t12.

The Q output signals (i) and (l) of the D-FFs 120 and 121 are respectively supplied to the D input terminals of the next-stage D-FFs 122 and 123. The D-FFs 122 and 123 are also configured to allow the clock signal ICLK (a) to enter as CLK input and thus sample, at the point of time on the leading edge of the waveform of the clock signal LCLK (a), the waveforms supplied to the D input terminals thereof. In this case, the time t8 is the point of time on the leading edge of the clock signal ICLK (a), so that the level values of the Q output signals (i) and (l) of the D-FFs 120 and 121 at this point of time are supposed to be sampled. As a result, a Q output signal (j) of the D-FF 122 and a Q output signal (m) of the D-FF 123 respectively become "H" and "L".

The time t12 is the point of time on the next leading edge of the clock signal ICLK (a), and the Q output signal (i) of the D-FF 120 and the Q output signal (l) of the D-FF 121 at this point of time are respectively at the "L" level and the "H" level, so that the Q output signal (j) of the D-FF 122 and the Q output signal (m) of the D-FF 123 respectively make the transition from the "H" level to the "L" level and from the "L" level to the "H" level.

The Q output signal (j) of the D-FF 122 is supplied to the input terminal A of the AND gate 124. The Q output signal (l) of the D-FF 121 is supplied to the input terminal B of the AND gate 124. This allows the Q output signal (l) of the D-FF 121 to make the transition to the "L" level at the point of time t4, so that an output signal (n) of the AND gate 124, that is, the DOWN pulse signal becomes "L". When the point of time t8 comes, the Q output signals (l) and (j) of the D-FFs 121 and 122 are supposed to make the transition to the "H" level, so that the output signal (n) of the AND gate 124 also makes the transition from the "L" level to the "H" level.

When the point of t12 comes, the Q output signal (j) of the D-FF 122 is supposed to make the transition from the "H" level to the "L" level, whereas the Q output signal (l) of the D-FF 121 is still at the "H" level. Thus, the output signal (n) of the AND gate 124, that is, the DOWN pulse signal makes the transition from the "H" level to the "L" level.

On the one hand, the Q output signal (m) of the D-FF 123 is supplied to the input terminal B of the AND gate 125. The Q output signal (i) of the D-FF 120 is supplied to the input terminal A of the AND gate 125. This allows the Q output signals (i) and (m) of the D-FFs 120 and 123 to make the transition from the "H" level to the "L" level at the point of time t8, so that an output signal (o) of the AND gate 125, that is, the UP pulse signal becomes "L". Then, when the point of time t12 comes, the Q output signal (m) of the D-FF 123 is supposed to make the transition from the "L" level to the "H" level, whereas the Q output signal (i) of the D-FF 120 is still at the "L" level, so that the output signal (o) of the AND gate 125 also maintains the "L" level.

In view of the above, an operation of the frequency detection circuit shown in FIG. 15 will be summarized as follows. Sampling (ICLK, QCLK)=(1,1) at a DATA change point followed by a certain DATA change point at which (ICLK, QCLK)=(0,1) is supposed to be sampled provides output of the UP pulse signal whose length is equivalent to a period of the clock signal ICLK. In other words, in the presence of m (m being an optional integer)-bit data between the two DATA change points, the clock signal ICLK in the period between the two DATA change points is supposed to be present in not more than m cycles, so that the pulse of the UP pulse signal is generated to set the frequency of the clock signal ICLK higher.

Alternatively, sampling (ICLK, QCLK)=(0,0) at the DATA change point followed by the certain DATA change point at which (ICLK, QCLK)=(0,1) is supposed to be sampled provides output of the DOWN pulse signal whose length is equivalent to a period of the clock signal ICLK. In other words, in the presence of m' (m' being an optional integer)-bit data between the two DATA change points, the clock signal ICLK in the period between the two DATA change points is supposed to be present in not less than m' cycles, so that the pulse of the DOWN pulse signal is generated to set the frequency of the clock signal ICLK lower.

When a complete coincidence of frequency between the clock signal ICLK and the input signal DATA is provided, the frequency detection circuit 102 keeps sampling any of (0,0), (0,1), (1,0) and (1,1) at the DATA change point, thereby eliminating the generation of the pulse of the UP pulse signal or the DOWN pulse signal.

As described above, the output signal (n) of the AND gate 124 and the output signal (o) of the AND gate 125 are respectively supplied as the DOWN pulse signal and the UP pulse signal to the charge pump circuit 104 in FIG. 14. Then, these DOWN/UP pulse signals are used to control the charge pump circuit 104 for smoothening (rectifying) an output current thereof, so that a control voltage of the VCO 106 is generated through the loop filter 105.

The above description has been given of the operation of the frequency detection circuit 102 in a case where duty ratios of the input signal DATA and each clock signal (ICLK, QCLK) are respectively assumed to be 100% and 50%. However, in optical communications or the like in particular, a duty distortion occurs in the transmitting signal DATA as shown in (b) and (c) in FIG. 17, so that the possibility exists that the PLL circuit may malfunction. FIG. 18 shows waveforms of the clock signals ICLK and QCLK and the transmitting signal DATA in the presence of the duty distortion.

As described above, the values of the clock signals ICLK and QCLK are sampled in the frequency detection circuit 102 of the related art at the change point of the input signal DATA. Thus, when the complete coincidence of frequency is provided, the sampled values of the clock signals ICLK and QCLK are respectively "0" and "1" at the change point between the corresponding points of time t2 and t3 to those in FIG. 16. In addition, the sampled values of the clock signals ICLK and QCLK are respectively "0" and "1" at the next change point between the points of time t6 and t7. Further, if the DATA change point is also present between the points of time t10 and t11, the sampled values of the clock signals ICLK and QCLK at this change point are also respectively "0" and "1". Accordingly, it may be proved that the sampled values at the above three change points are all the same.

However, as clearly shown by a timing chart of FIG. 18 showing a timing relation when the distortion occurs in each of the input signals DATA whose duty ratios are different, the clock signal QCLK is supposed to be a signal of a waveform whose phase is delayed by 90 degrees to the clock signal ICLK, and the duty ratio of the input signal DATA becomes greater as against clock signal QCLK so as to provide the input signal DATA whose width of "H" level equivalent to one bit is greater than the period of the clock signal ICLK. In this case, if the leading edge of the input signal DATA is provided between the points of time t1 and t2, the level values of the clock signals ICLK and QCLK at the point of time on the leading edge thereof are respectively "1" and "1".

Subsequently, both the level values of the clock signals ICLK and QCLK are respectively changed to "0" at the point of time on the trailing edge of the input signal DATA in the period between the points of time t7 and t8. Thus, the sampled values of the clock signals ICLK and QCLK at the points of time on the leading and trailing edges of the input signal DATA are subject to variations from (1, 1) to (0, 0), and as a result, it is proved that the frequency detection circuit may malfunction.

On the other hand, when the duty ratio of the input signal DATA becomes smaller so as to provide the input signal DATA whose width of "H" level equivalent to one bit is smaller than the period of the clock signal ICLK, both the level values of the clock signals ICLK and QCLK are respectively "0" at the point of time on the leading edge of the input signal DATA in the period between the points of time t3 and t4, as shown in FIG. 18. However, both the level values of the clock signals ICLK and QCLK are respectively changed to "0" at the point of time on the trailing edge of the input signal DATA in the period between the points of time t5 and t6. Thus, the sampled values of the clock signals ICLK and QCLK are subject to variations from (0,0) to (1,1), and as a result, the frequency detection circuit may malfunction.

A general configuration of the phase detection circuit 101 will be now described. FIG. 19 is a block diagram showing a circuit configuration of the phase detection circuit 101. The circuit configuration of the phase detection circuit 101 will be described at first.

In FIG. 19, a data input terminal 131 to which the input signal DATA is supplied is connected to a D input terminal of a D-FF 133 and also to one input terminal A of a dual-input exclusive OR (hereinafter referred to as EX-OR) gate 135. On the one hand, a CLK input terminal 132 to which the oscillation frequency clock VCOCLK of the VCO 106 is supplied is connected to a CLK terminal of the D-FF 133 and also to an inverting CLK terminal of a D-FF 134.

A Q output terminal of the D-FF 133 is connected to the other input terminal B of the EX-OR gate 135, one input terminal A of a dual-input EX-OR gate 136 and a D input terminal of the D-FF 134. A Q output terminal of the D-FF 134 is connected to the other input terminal B of the EX-OR gate 136. An output terminal of the EX-OR gate 135 is connected to an UP output terminal 137, and an output terminal of the EX-OR gate 136 is connected to a DOWN- output terminal 138.

Subsequently, a circuit operation of the phase detection circuit 101 having the above configuration will be described with reference to a timing chart of FIG. 20. Incidentally, reference codes (a) to (f) in the timing chart of FIG. 20 respectively represent waveforms as those of nodes shown by reference codes (a) to (f) in FIG. 19.

Now assume that the times t0, t2, t4, t6, t8, t10, t12 and t14 are the points of time on the leading edge of an oscillation frequency clock VCOCLK (a) supplied from the VCO 106 (See FIG. 14) through the CLK input terminal 132, and the times t1, t3, t5, t7, t9, t11, t13 and t15 are the points of time on the trailing edge thereof.

An input signal DATA (b) is a signal of a waveform, which is supposed to be on the "L" level in the period between the trailing edge between the points of time t1 and t2 and the leading edge between the points of time t5 and t6, and then maintain the "H" level up to the trailing edge between the points of time 8 and t9, then the "L" level up to the leading edge between the points of time t10 and t11, then the "H" level up to the trailing edge between the points of time t12 and t13, and thereafter the "L" level up to the point of time t15.

The "L" level value of the input signal DATA (b) is sampled in the D-FF 133 at the point of time t2 on the leading edge of the oscillation frequency clock VCLCLK (a). This allows a Q output signal (c) of the D-FF 133 to make the transition from the "H" level to the "L" level. The input signal DATA (b) is still at the "L" level without the transition of the level thereof at the point of time t4 on the next leading edge of the oscillation frequency VCOCLK (a), so that the Q output signal (c) of the D-FF 133 also maintains the "L" level without the transition of the level thereof.

The input signal DATA (b) is supposed to be at the "H" level at the point of time t6 on the next leading edge of the oscillation frequency VCLCLK (a), so that the Q output signal (c) of the D-FF 133 makes the transition from the "L" level to the "H" level. Then, the input signal DATA (b) is still at the "H" level at the point of time t8 on the next leading edge of the oscillation frequency clock VCOCLK (a), and the "H" level value thereof is sampled, so that the Q output signal (c) of the D-FF 133 maintains the "H" level without the transition of the level thereof.

When the point of time t10 comes, the input signal DATA (b) is supposed to be at the "L" level, so that the Q output signal (c) of the D-FF 133 also makes the transition from the "H" level to the "L" level. When the point of time t12 comes, the input signal DATA (b) is supposed to be at the "H" level, so that the Q output signal (c) of the D-FF 133 also makes the transition from the "L" level to the "H" level. When the point of time t14 on the next leading edge of the oscillation frequency clock VCOCLK (a) comes, the input signal DATA (b) is supposed to be at the "L" level. This allows the D-FF 133 to sample the "L" level value of the input signal DATA (b), so that the Q output signal (c) of the D-FF 133 makes the transition from the "H" level to the "L" level.

On the one hand, the oscillation frequency clock VCO-CLK (a) with an inverted polarity is supplied to the D-FF 134 as CLK input thereof. Thus, the D-FF 134 is supposed to sample the input signal DATA at the points of time t1, t3, t5, t7, t11, t13 and t15 on the trailing edge of the oscillation frequency clock VCOCLK (a).

The Q output signal (c) of the D-FF 133 is supposed to be at the "H" level at the point of time t1, so that a Q output signal (d) of the D-FF 134 becomes "H", and thereafter, maintains the "H" level up to the point of time t3 on the next trailing edge of the oscillation frequency clock VCOCLK (a). When the point of time t3 comes, the Q output signal (c) of the D-FF 133 is supposed to be at the "L" level, so that sampling the "L" level value thereof allows the Q output signal (d) of the D-FF 134 to make the transition from the "H" level to the "L" level. Then, the Q output signal (d) thereof maintains the "L" level up to the point of time immediately before the point of time t7 after going through the point of time t5.

The Q output signal (c) of the D-FF 133 is supposed to be at the "H" level at the point of time t7 on the next trailing edge of the oscillation frequency clock VCLCLK (a), so that sampling the "H" level value thereof allows the Q output signal (d) of the D-FF 134 to make the transition from the "L" level to the "H" level. The level of the Q output signal (c) of the D-FF 133 remains unchanged at the point of time t9. The Q output signal (c), however, makes the transition from the "H" level to the "L" level at the point of time t10 and then maintains the "L" level up to the point of time t12.

The Q output signal (c) of the D-FF 133 is supposed to be at the "L" level at the point of time t11, so that sampling the "L" level value thereof in the D-FF 134 allows the Q output signal (d) of the D-FF 134 to make the transition from the "H" level to the "L" level.

The Q output signal (c) of the D-FF 133 is supposed to be at the "H" level at the point of time t13, so that sampling the "H" level value thereof in the D-FF 134 allows the Q output signal (d) of the D-FF 134 to make the transition from the "L" level to the "H" level. Information on the "H" level thereof is maintained up to the point of time t15 on the next trailing edge of the oscillation frequency clock VCLCLK (a), and the "L" level value of the Q output signal (c) of the D-FF 133 is then sampled in the D-FF 134. This allows the Q output signal (d) of the D-FF 134 to make the transition from the "H" level to the "L" level.

An operation of the EX-OR gate 135 that generates an UP pulse signal (e) will be now described with reference to the timing chart of FIG. 20. Incidentally, assume that the input signal DATA (b) and the Q output signal (c) of the D-FF 133 are respectively supplied to the two input terminals A and B of the EX-OR gate 135.

It is also assumed that the period in which the input signal DATA (b) is different in logic value from the Q output signal (c) of the D-FF 133 is one between the point of time at which the input signal DATA (b) is supposed to make the transition from the "H" level to the "L" level between the points of time t1 and t2 and the point of time t2 at which the Q output signal (c) of the D-FF 133 is supposed to be at the "H" level, one between the point of time at which the input signal DATA (b) is supposed to make the transition from the "L" level to the "H" level between the points of time t5 and t6 and the point of time t6 at which the Q output signal (c) of the D-FF 133 is supposed to make the transition from the "L" level to the "H" level, one between the point of time at which the input signal DATA (b) is supposed to make the transition from the "H" level to the "L" level between the points of time t8 and t9 and the point of time t10, one between the point of time at which the input signal DATA (b) is supposed to make the transition from the "L" level to the "H" level between the points of time t10 and t11 and the point of time t12 and one between the point of time at which the input signal DATA (b) is supposed to make the transition from the "H" level to the "L" level between the points of time t12 and t13 and the point of time t14.

Then, an output signal (e) of the EX-OR gate 135 is supposed to be at the "H" level in the above periods. On the other hand, the input signal DATA (b) and the Q output signal (c) of the D-FF 133 are respectively supposed to be at the "H" level or the "L" level in the periods other than the above periods, so that the output signal (e) of the EX-OR gate 135 becomes "L". The output signal (e) of the EX-OR gate 135 is adapted for the UP pulse signal.

An operation of the EX-OR gate 136 that generates a DOWN pulse signal (f) will be now described with reference to the timing chart of FIG. 20. Incidentally, assume that the Q output signal (c) of the D-FF 133 and the Q output signal (d) of the D-FF 134 are respectively supplied to the two input terminals A and B of the EX-OR gate 136.

It is also assumed that the period in which the Q output signal (c) of the D-FF 133 is different in logic value from the Q output signal (d) of the D-FF 134 is one between the points of time t2 and t3, one between the points of time t6 and t7, one between the points of time t10 and t11, one between the points of time t12 and t13 and one between the points of time t14 and t15.

Then, the output signal (f) of the EX-OR gate 136 is supposed to be at the "H" level in the above periods. On the other hand, the Q output signal (c) of the D-FF 133 and the Q output signal (d) of the D-FF 134 are respectively supposed to be at the "H" level or the "L" level in the periods other than the above periods, so that the output signal (f) of the EX-OR gate 136 "L". The output signal (f) of the EX-OR gate 136 is adapted for the DOWN pulse signal.

As described above, the pulse waveforms of the UP pulse signal (e) and the DOWN pulse signal (f) are respectively generated one at a time on every transition of the input signal DATA. The circuit configuration described above is adaptable to provide the DOWN pulse signal (f) whose pulse width is always constant, so that a phase control takes place by adjusting the pulse width of the UP pulse signal (e).

In the absence of the duty distortion in the input signal DATA, the oscillation frequency clock VCOCLK of the VCO 106 is locked to the input signal DATA under a control based on each control signal (the UP pulse signal and the DOWN pulse signal) of the frequency detection circuit 102 and the phase detection circuit 101, thereby providing the point of time on the leading edge of the clock signal ICLK so as to be positioned at the center of an eye pattern of the input signal DATA, as shown in the timing chart of FIG. 21.

On the other hand, the frequency detection circuit 102 is supposed to sample the values (the levels) of the clock signals ICLK and QCLK at the change point of the input signal DATA as described above, thereby providing the frequency information by using the sampled values thereof. In this case, if a phase relation between the clock signal ICLK and the input signal DATA is assumed to be one as shown in FIG. 21, the point of time on the trailing edge of the clock signal ICLK may be coincident with the change point of the input signal DATA.

Thus, the frequency detection circuit 102 is supposed to provide the unstable sampled value of the clock signal ICLK at the change point of the input signal DATA in proportion as the duty ratio of the input signal DATA is varied (provided that the sampled value of the clock signal QCLK is more stable than that of the clock signal ICLK). At this time, a wrong detection on the frequency information takes place in the frequency detection circuit 102, resulting in a generation of an erroneous control signal.

As described above, in the conventional PLL circuit having the phase detection circuit 101 and the frequency detection circuit 102, the clock signals ICLK and QCLK are sampled in the frequency detection circuit 102 at the change point of the input signal DATA. Thus, the presence of the duty distortion in the input signal DATA causes the frequency detection circuit 102 to output the erroneous control signal (the UP pulse signal and the DOWN pulse signal).

In addition, when the oscillation frequency clock VCLCLK of the VCO 106 is locked to the input signal DATA, the operation of the phase detection circuit 101 provides the eye pattern center of the input signal DATA so as to be positioned at the point of time on the leading edge of the clock signal ICLK. Thus, the frequency detection circuit 102 is supposed to provide the unstable sampled value of the clock signal ICLK in proportion as the duty ratio of the input signal DATA is slightly varied, resulting in the generation of the erroneous control signal from the frequency detection circuit 102.

SUMMARY OF THE INVENTION

According to the present invention, in a PLL circuit having a VCO, a phase detection circuit and a frequency detection circuit or an optical communications receiving apparatus having the PLL circuit, a configuration of the PLL circuit is provided as follows. In other words, a signal generation circuit is provided, which generates, on the basis of an oscillation frequency signal of the VCO, a first signal whose phase is the same as the oscillation frequency signal of the VCO, a second signal whose phase is delayed by a first phase to the first signal and a third signal whose phase is delayed by a second phase to the first signal. The frequency detection circuit is also provided, which samples the first and second signals synchronously with an input signal, thereby generating an UP/DOWN frequency control signal when a combination of "H" level and "L" level logic values of the two sampled signals is of a specific pattern. The second phase is supposed to be a phase, which is set such that a change point of the third signal is positioned within the specific pattern. The phase detection circuit is further provided, which generates a phase control signal on the basis of a phase difference between the third signal and the input signal.

In the PLL circuit of the above configuration, the phase detection circuit provides a phase control based on the phase difference between the third signal and the input signal so as to satisfy the above phase requirements, so that the change point of the third signal is set at a center portion of a pulse waveform (an eye pattern) of the input signal, instead of the change point of the input signal. This allows the frequency detection circuit to improve a proof to a meta-stable state produced when a duty ratio of the input signal is varied, at the point of time when the first and second signals are sampled at the point close to the lock point of a specific frequency. Thus, even if the duty ratio of the input signal is varied, a converging time required for frequency detection in the frequency detection circuit is reduced, and malfunctions attributable to the control signal of the frequency detection circuit hardly take place.

BRIEF DESCRIPTION OF THE DRAWINGS

The foregoing and other objects and features of the invention will become apparent from the following description of preferred embodiments of the invention with reference to the accompanying drawings, in which.

DETAILED DESCRIPTION OF THE PREFERRED EMBODIMENTS

Figure 1:
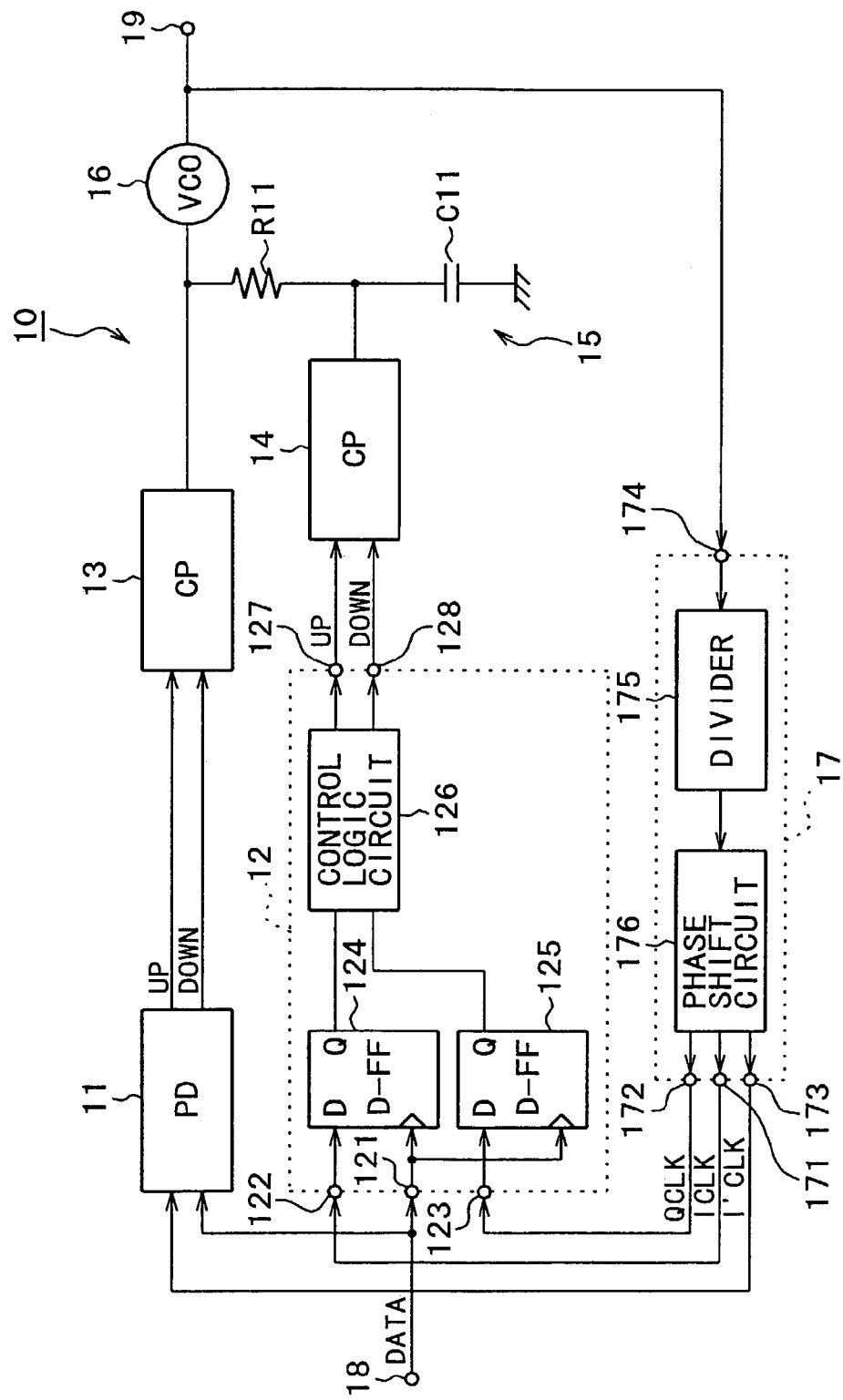
FIG. 1 is a block diagram showing a configuration of a PLL circuit according to a preferred embodiment of the present invention.

FIG. 1 is a block diagram showing a configuration of a PLL circuit according to a preferred embodiment of the present invention. Although the embodiment of the present invention will be herein described by taking a case where the PLL circuit of the present invention is applied to a receiving apparatus in optical communications, for instance, it is to be understood that the present invention is not limited to the above application.

In FIG. 1, a PLL circuit 10 of the present invention comprises a phase detection (PD) circuit 11, a frequency detection (FD) circuit 12, charge pump (CP) circuits 13 and 14, a loop filter 15, a VCO (Voltage-Controlled Oscillator) 16 and a clock generator 17. In addition, a serial digital signal DATA is supplied as an input signal to a circuit input terminal 18 of the PLL circuit 10 of the present invention. A signal of an NRZ (waveform) is herein adopted as the digital signal DATA used for optical communications.

The circuit input terminal 18 is connected to one input terminal (a data input terminal) of the phase detection circuit 11 and also to a data input terminal 121 of the frequency detection circuit 12. The other input terminal of the phase detection circuit 11 is connected to an I'CLK output terminal 173 of the clock generator 17. An ICLK input terminal 122 and a QCLK input terminal 123 of the frequency detection circuit 12 are, respectively, connected to an ICLK output terminal 171 and a QCLK output terminal 172 of the clock generator 17.

An output terminal of the phase detection circuit 11 is connected to an input terminal of the charge pump circuit 13.

An output terminal of the charge pump circuit 13 is connected to a control input terminal of the VCO 16 through the loop filter 15. Output terminals 127 and 128 of the frequency detection circuit 12 are respectively connected to corresponding input terminals of the charge pump circuit 14. An output terminal of the charge pump circuit 14 is also connected to the control input terminal of the VCO 16 through the loop filter 15.

The loop filter 15 has, for instance, a low pass filter configuration including a resistance R11 connected to both the output terminals of the charge pumps 13 and 14, and a capacitor C11 connected to both the output terminal of the charge pump circuit 14 and the ground. An output terminal of the VCO 16 is connected to a circuit output terminal 19 and also to a clock input terminal 174 of the clock generator 17.

The clock generator 17 has a divider 175 and a phase shift circuit 176, and is configured to generate, on the basis of an oscillation frequency clock of the VCO 16, first, second and third signals whose phases are different from one another, in other words, a clock signal ICLK whose phase is the same (In Phase) as the oscillation frequency clock of the VCO 16, a clock signal QCLK whose phase is shifted to the clock signal ICLK by a first phase, for instance, 90 degrees (Quadrature Phase) and a clock signal I'CLK whose phase is shifted to the clock signal ICLK by a second phase limited to a range from more than 180 degrees to less than 270 degrees, preferably 225 degrees, for instance.

Specifically, the divider 175 divides the oscillation frequency clock of the VCO 16 at a predetermined dividing ratio (1/n) to supply the divided clock to the phase shift circuit 176. The phase shift circuit 176 outputs the divided clock, which is provided by the divider 175, through the output terminal 171 intact as the clock signal ICLK, also through the output terminal 172 as the clock signal QCLK after shifting the phase of the divided clock to the clock signal ICLK by 90 degrees, for instance, and further through the output terminal 173 as the clock signal I'CLK after shifting the phase of the divided clock to the clock signal ICLK by 225 degrees, for instance.

Figure 2:
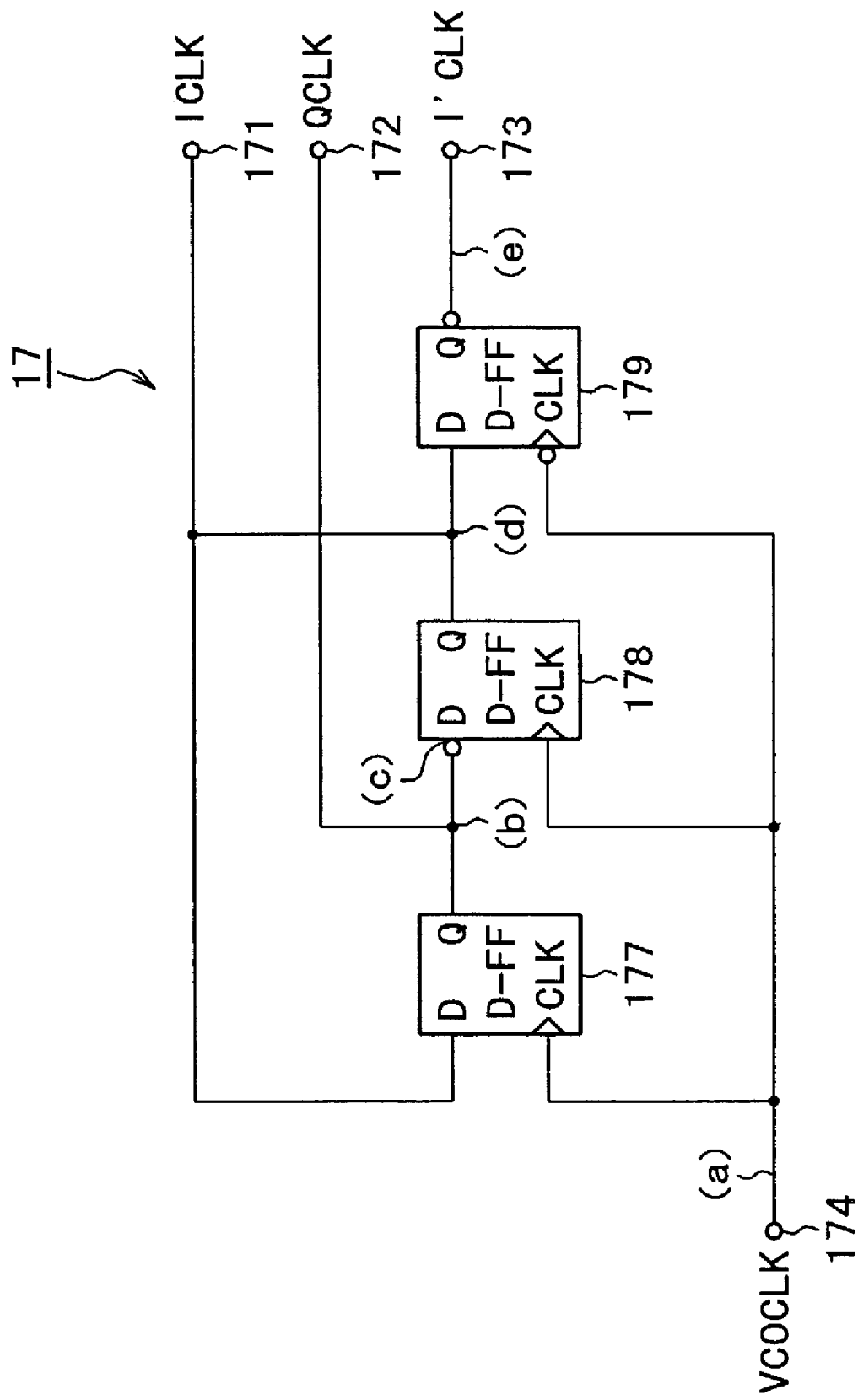
FIG. 2 is a block diagram showing a specific circuit configuration of a clock generator of the PLL circuit shown in FIG. 1.

FIG. 2 shows a specific circuit configuration of the clock generator 17 including the divider. The dividing ratio (1/n) used herein is given on the assumption that n=4. The clock generator 17 in this case has a configuration including three pieces of cascaded D-FFs 177, 178 and 179.

In FIG. 2, each of CLK terminals of the three pieces of D-FFs 177, 178 and 179 is connected to the clock input terminal 174. The CLK terminal of the D-FF 179 used herein is an inverting input terminal to which the oscillation frequency clock VCOCLK with an inverted polarity is supplied from the VCO 16 through the clock input terminal 174.

A D input terminal of the first-stage D-FF 177 is connected to a Q output terminal of the second-stage D-FF 178. In addition, a Q output terminal of the first-stage D-FF 177 is connected to the QCLK output terminal 172 and also to a D input terminal of the second-stage D-FF 178. The D input terminal of the second-stage D-FF 178 is an inverting input terminal to which a Q output signal with an inverted polarity is supplied from the first-stage D-FF 177. A Q output terminal of the second-stage D-FF 178 is connected to the ICLK output terminal 171 and also to a D input terminal of the third-stage D-FF 179. The Q output terminal of the third-stage D-FF 179 is an inverting output terminal and is also connected to the I'CLK output terminal 173.

Figure 3:
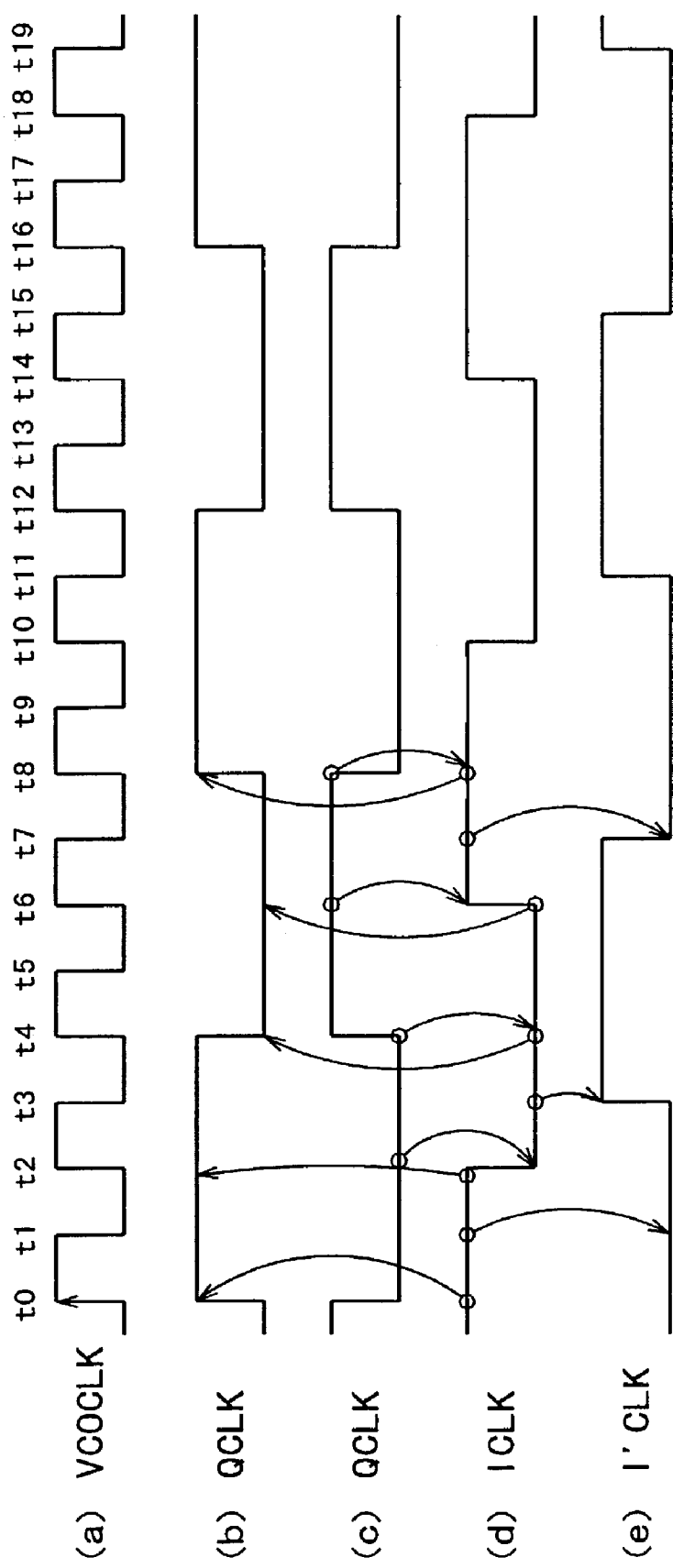
FIG. 3 is a timing chart for illustrating a circuit operation of the clock generator shown in FIG. 2.

A circuit operation of the clock generator 17 having the above configuration will be now described with reference to a timing chart of FIG. 3. Incidentally, reference codes (a) to (e) in the timing chart of FIG. 3 respectively represent waveforms as those of nodes shown by reference codes (a) to (e) in FIG. 2. In addition, it is assumed that the D-FFs 177, 178 and 179 sample, at the point of time on the leading edge of the clock CLK, the waveform supplied to the D input terminals thereof.

If a Q output signal (d) of the D-FF 178 is supposed to already be at the "H" level prior to a point of time t0, the D-FF 177 samples a "H" level value thereof at the point of time t0, so that a Q output signal (b) of the D-FF 177 makes the transition from the "L" level to the "H" level. This allows a D input signal (c) of the D-FF 178, that is, an inverted signal of the Q output signal (b) to make the transition from the "H" level to the "L" level. However, the D-FF 178 is supposed to sample the last "H" level value of the D input signal (c) before the transition from the "H" level to the "L" level, so that the Q output signal (d) of the D-FF 178 maintains the "H" level. In addition, the D-FF 179 is configured to have the inverting input terminal as the CLK terminal thereof, and thus sample, at the point of time t1, the waveform supplied to the D input terminal thereof, so that the inverted Q output signal (e) thereof maintains the "L" level.

When the point of time t2 comes, a "H" level (the last level of the Q output signal (d) before the transition from the "H" level to the "L" level) Q output signal (d) of the D-FF 178 is supplied to the D input terminal of the D-FF 177, so that the Q output signal (b) of the D-FF 177 maintains the "H" level. At this time, the D input signal (c) of the D-FF 178 is supposed to be at the "L" level, so that the Q output signal (d) thereof makes the transition from the "H" level to the "L" level. Thus, the "L" level Q output signal (d) of the D-FF 178 is supplied to the D-FF 179 as the D input thereof, so that the inverted Q output signal (e) of the D-FF 179 makes the transition from the "L" level to the "H" level at the point of time t3.

The "L" level Q output signal (d) of the D-FF 178 is supplied to the D input terminal of the D-FF 177 at the point of time t4, and the D-FF 177 samples the "L" level value thereof, so that the Q output signal (b) of the D-FF 177 makes the transition from the "H" level to the "L" level. The "L" level Q output signal (b) with an inverted polarity is then supplied to the D-FF 178 as the D input thereof. However, the D-FF 178 is supposed to sample the last "L" level value of the Q output signal (b) before the inverting thereof, so that the Q output signal (d) of the D-FF 178 maintains the "L" level.

The "L" level Q output signal (d) of the D-FF 178 is supplied to the D input terminal of the D-FF 177 at the point of time t6, so that the Q output signal (b) of the D-FF 177 maintains the "L" level. At this time, the "H" level signal is supplied to the inverting D input terminal of the D-FF 178, and the D-FF 178 samples the "H" level value thereof, so that the Q output signal (d) of the D-FF 178 makes the transition from the "L" level to the "H" level.

The "H" level Q output signal (d) of the D-FF 178 is supplied to the D-FF 179 as the D input thereof at the point of time t7, and the D-FF 179 samples the "H" level value thereof, so that the inverted Q output signal (e) of the D-FF 179 makes the transition from the "H" level to the "L" level. When the point of time t8 comes, the "H" level Q output signal (d) of the D-FF 178 is supplied to the D input terminal of the D-FF 177, and the D-FF 177 samples the "H" level value thereof, so that the Q output signal (b) of the D-FF 177 makes the transition from the "L" level to the "H" level. This allows the inverted D input signal of the D-FF 178 to make the transition from the "H" to the "L" level. However, the D-FF 178 is supposed to sample the last "H" level value of the Q output signal (b) before the inverting thereof, so that the Q output signal (d) of the D-FF 178 maintains the "H" level.

In the following, the operation from the point of time t1 to the point of time t8 as described above will be repeated in a similar manner in the period between the points of time t9 and t19.

If the clock signals ICLK and I'CLK are respectively the clock signal derived from the Q output terminal of the D-FF 178 and the clock signal derived from the inverting Q output terminal of the D-FF 179, a phase delay by 225 degrees to the clock signal ICLK is provided for the clock signal I'CLK, by reason that the CLK terminal of the D-FF 179 is the inverting input terminal. Alternatively, if the clock signal QCLK is the clock signal derived from the Q output terminal of the D-FF 177, a phase delay by 90 degrees to the clock signal ICLK is provided for the clock signal QCLK.

The clock signal I'CLK generated in the clock generator 17 is supplied to the phase detection circuit 11 shown in FIG. 1 so as to function as a signal for the phase detection. On the other hand, the clock signals ICLK and QCLK generated in the clock generator 17 are supplied to the frequency detection circuit 12 shown in FIG. 1 so as to function as reference signals for the frequency detection.

Referring to the PLL circuit 10 shown in FIG. 1 again, the digital signal of the NRZ waveform is supplied to one input terminal of the phase detection circuit 11 and also to the data input terminal 121 of the frequency detection circuit 12 through the circuit input terminal 18. On the one hand, the clock signal I'CLK generated in the clock generator 17 is supplied to the other input terminal of the phase detection circuit, and the clock signals ICLK and QCLK generated in the clock generator 17 are respectively supplied to the ICLK input terminal 122 and the QCLK input terminal 123 of the frequency detection circuit 12.

The frequency detection circuit 12 has a configuration including two pieces of D-FFs 124, 125 and a control logic circuit 126. A D input terminal of the D-FF 124 is connected to the ICLK input terminal 122 and a CLK terminal thereof is connected to the data input terminal 121. A D input terminal of the D-FF 125 is connected to the QCLK input terminal 123 and a CLK terminal thereof is connected to the data input terminal 121.

Figure 4:
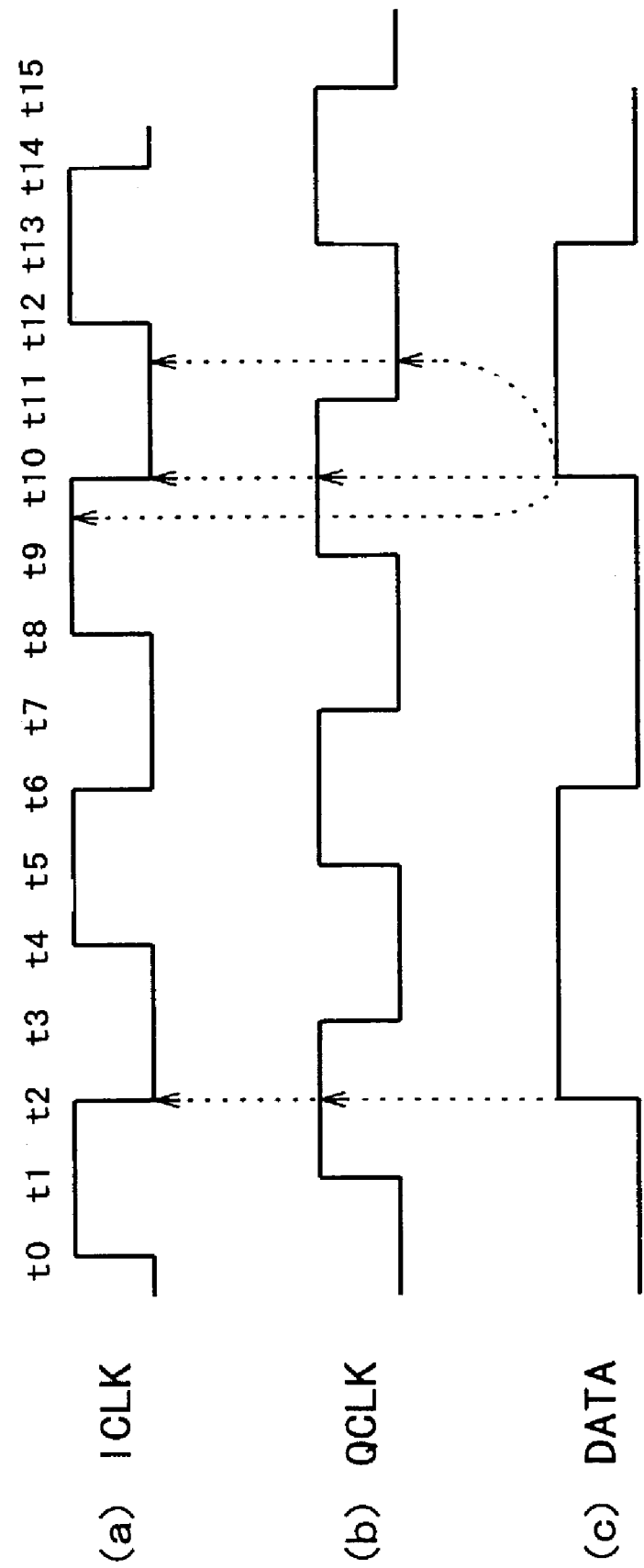
FIG. 4 is a timing chart for illustrating a circuit operation of a frequency detection circuit of the PLL circuit shown in FIG. 1.

A circuit operation of the frequency detection circuit 12 having the two pieces of the D-FFs 124, 125 and the control logic circuit 126 will be now described with reference to a timing chart of FIG. 4.

Assume that the timing waveform of the clock signal ICLK supplied to the ICLK input terminal 122 is at the "H" level in the period between the points of time t0 and t2, the "L" level in the period between the points of time t2 and t4, the "H" level in the period between the points of time t4 and t6, the "L" level in the period between the points of time t6 and t8, the "H" level in the period between the points of time t8 and t10, the "L" level in the period between the points of time t10 and t12 and further the "H" level in the period between the points of time t12 and t14.

It is also assumed that the clock signal QCLK supplied to the QCLK input terminal 123 is a signal of a waveform whose phase is delayed by 90 degrees to the clock signal ICLK, in other words, the waveform thereof is at the "H" level in the period between the points of time t1 and t3, the "L" level in the period between the points of time t3 and t5, the "H" level in the period between the points of time t5 and t7, the "L" level in the period between the points of time t7 and t9, the "H" level in the period between the points of time t9 and t11, the "L" level in the period between the points of time t11 and t13 and the "H" level in the period between the points of time t13 and t15.

It is further assumed that the waveform of the input signal DATA supplied to the data input terminal 121 is at the "L" level in the period between the points of time t0 and t2, the "H" level in the period between the points of time t2 and t6, the "L" level in the period between the points of time t6 and t10, the "H" level in the period between the points of time t10 and t13 and the "L" level on and after the point of time t13.

Now, if the D-FFs 124 and 125 are supposed to sample D input data at the point of time on the leading edge of the clock signal, a specific pattern (ICLK, QCLK)=(0,1) among four patterns (0,0), (0,1), (1,0) and (1,1) of the combination of logic levels of the clock signals ICLK and QCLK is sampled at the point of time t2, and a value corresponding to the data thereof is then supplied as the Q output signal to the next-stage control logic circuit 126.

The frequency detection circuit 12 provides functions of opening a window when the data supplied to the D input terminals of the D-FFs 124 and 125 is used to sample the specific value (0,1), and outputting a result of comparison depending on the next sampled value.

If the time t10 is the point of time on the leading edge of the input signal DATA followed by the leading edge thereof at the point of time t2, the D input terminals of the D-FF 124 and 125 are supposed to provide (0, 1) for the sampled data values. At this time, the clock frequencies are judged to be coincident in the next-stage control logic circuit 126, so that no output is provided.

In addition, if the time between the points of time t9 and t10 is the sampling point of time followed by the point of time at which (0, 1) is sampled, (1,1) is provided for the sampled data values. At this time, the clock frequency is judged to be lower in the next-stage control logic circuit 126, so that the UP pulse is outputted to set the clock frequency higher. On the other hand, if (0, 0) is sampled on the assumption that the time between the points of time t11 and t12 is the sampling point of time followed by the point of time at which (0,1) is sampled, the clock frequency is judged to be higher in the control logic circuit 126, so that the DOWN pulse signal is outputted to set the clock frequency lower.

As described above, the digital signal (pulse signal) of the UP/DOWN signal provided by detecting the frequency with the frequency detection circuit 12 is supplied to the next-stage charge pump circuit 14 to control ON/OFF of a transistor of the charge pump circuit 14, thereby controlling outflow or inflow of a current, for instance. The charge pump circuit 14 that controls the current as described above is made up of a MOS transistor or a bipolar transistor, for instance. An output current from the charge pump circuit 14 is rectified with the loop filter 15 for conversion into a DC voltage (a DC signal), which is then provided to the VCO 16 as a control voltage thereof.

The VCO 16 has a configuration including a variable capacitance element, so that the above DC voltage is applied as the control voltage to the variable capacitance element. The variable capacitance element varies a capacity thereof depending on the control voltage applied thereto, thereby controlling the frequency of the oscillation frequency clock of the VCO 16. The oscillation frequency clock of the VCO 16 is fed back to the frequency detection circuit 12 through the clock generator 17.

The frequency detection circuit 12 compares the frequency of the fed-back clock signals ICLK and QCLK with that of the digital signal DATA of the NRZ waveform. The frequency control operation by the above frequency comparison is repeated, thereby locking the frequency of the oscillation frequency clock of the VCO 16 to an objective frequency of the input signal DATA. This locked state allows the loop filter 15 to provide the constant output voltage, and thereafter, the output voltage thereof remains unchanged unless frequency variations occur.

When the frequency of the oscillation frequency clock of the VCO 16 is locked to the objective frequency of the input signal DATA, the operation of the frequency detection circuit 12 enters a fixed state (that is, the UP/DOWN signal equivalent to the output signal of the frequency detection circuit 12 is fixed to the "L" level). At this time, if a current for charging or discharging an electric charge of the capacitor C11 of the charge pump circuit 14 is quite higher than that of the charge pump circuit 13, the phase detection circuit 11 is supposed to be substantially operated following the operation of the frequency detection circuit 12.

In other words, a DC voltage based on the detection output of the phase detection circuit 11 is superposed on a DC voltage based on the detection output of the frequency detection circuit 12 with the loop filter 15 to further vary the control voltage applied to the VCO 16, thereby controlling the phase of the oscillation frequency clock of the VCO 16.

Specifically, a phase delay or advance of the clock signal I'CLK, in its turn, the oscillation frequency clock of the VCO 16 to the input signal DATA is detected in the phase detection circuit 11. The output digital (pulse) signal of the phase detection circuit 11 is supplied to the next-stage charge pump circuit 13 depending on the phase delay or advance thereof to control ON/OFF of the transistor of the change pump circuit 13, thereby controlling the outflow or inflow of the current, for instance. The charge pump circuit 13 that controls the current as described above is made up of the MOS transistor or the bipolar transistor, for instance, similarly to the charge pump circuit 14 on the side of the frequency detection circuit 12.

The output current from the charge pump circuit 13 is rectified with the loop filter 15 for conversion into the DC voltage. The DC voltage thus provided is superposed on the DC voltage on the side of the frequency detection circuit 12 with the loop filter 15, and a resultant DC voltage is then supplied to the VCO 16 as the control voltage thereof to be applied to the variable capacitance element described above. The variable capacitance element varies the capacity thereof depending on the control voltage applied thereto, thereby controlling the phase of the oscillation frequency clock of the VCO 16.

The VCO 16 oscillation frequency clock whose phase has been controlled is fed back as the clock signal I'CLK to the phase detection circuit 11 through the clock generator 17. The phase detection circuit 11 compares the phase of the feed back clock signal I'CLK with that of the digital signal DATA of the NRZ waveform. Then, the phase detection and phase control operations are repeated, so that a coincidence between the phase of the oscillation frequency clock of the VCO 16 and that of the input signal DATA is finally provided as well.

The PLL circuit 10 of the present invention is configured such that the charge pump circuits 13 and 14 of the single output configurations are used, the VCO 16 of the single input configuration is also used, and the loop filter 15 of the configuration having the resistance R11 connected both to the output terminals of the charge pump circuits 13 and 14 and the capacitor C11 connected both to the output terminal of the charge pump circuit 14 and the ground is also used. Alternatively, it is to be understood that the present invention is not limited to the PLL circuit of the above configurations.

Figure 5:
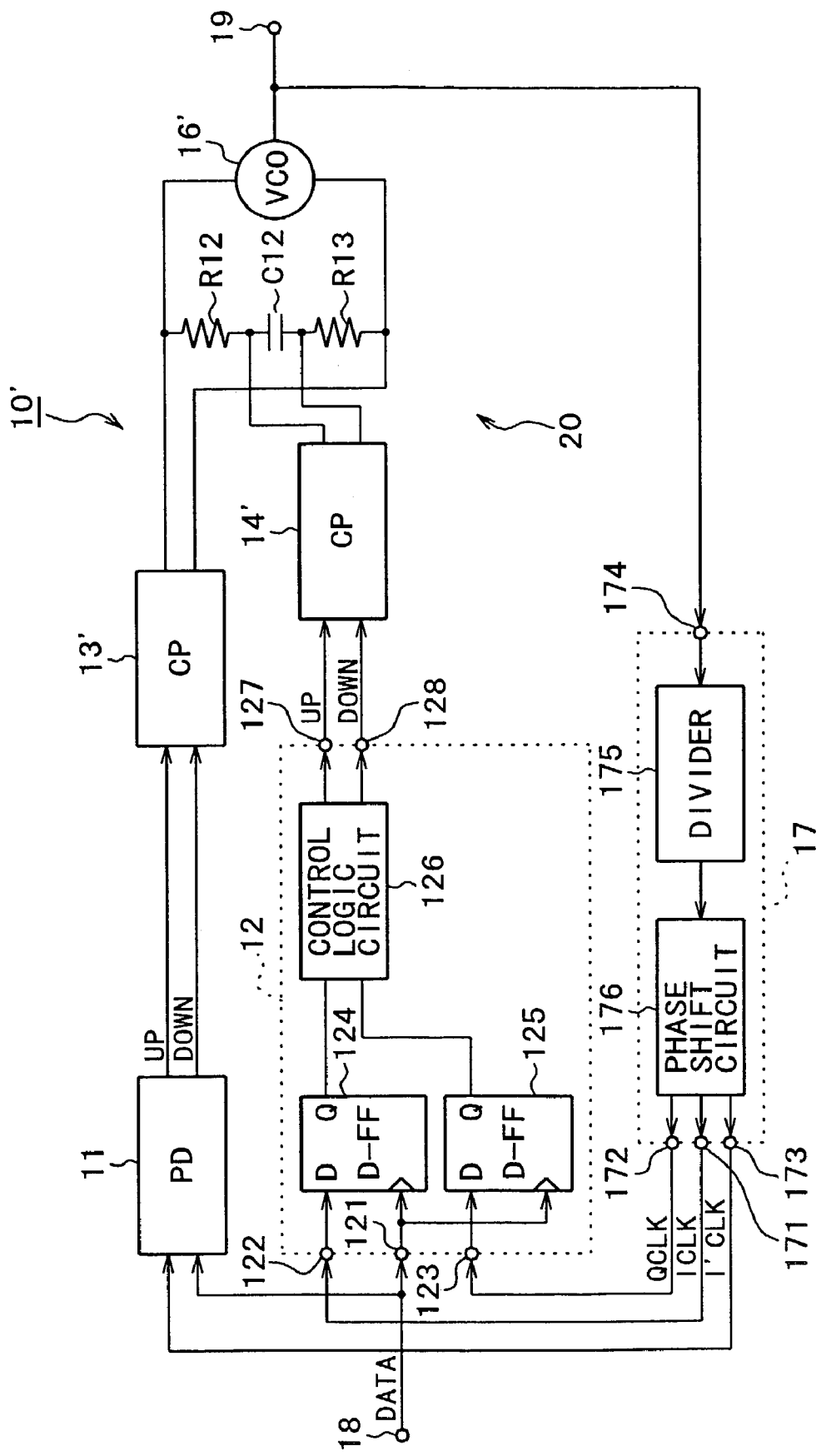
FIG. 5 is a block diagram showing a modification of the PLL circuit according to the preferred embodiment of the present invention.

In other words, the PLL circuit may also be a PLL circuit 10' having charge pump circuits 13' and 14' of differential output configurations, a VCO 16' of a differential input configuration and a loop filter 20' of a configuration having a resistance R12 connected to one output terminal of each of the charge pump circuits 13' and 14' a capacitor C12 connected to each differential output terminal of the charge pump circuit 14' and a resistance R13 connected to the other output terminal of each of the charge pump circuits 13' and 14', as shown in FIG. 5, for instance.

Figure 6:
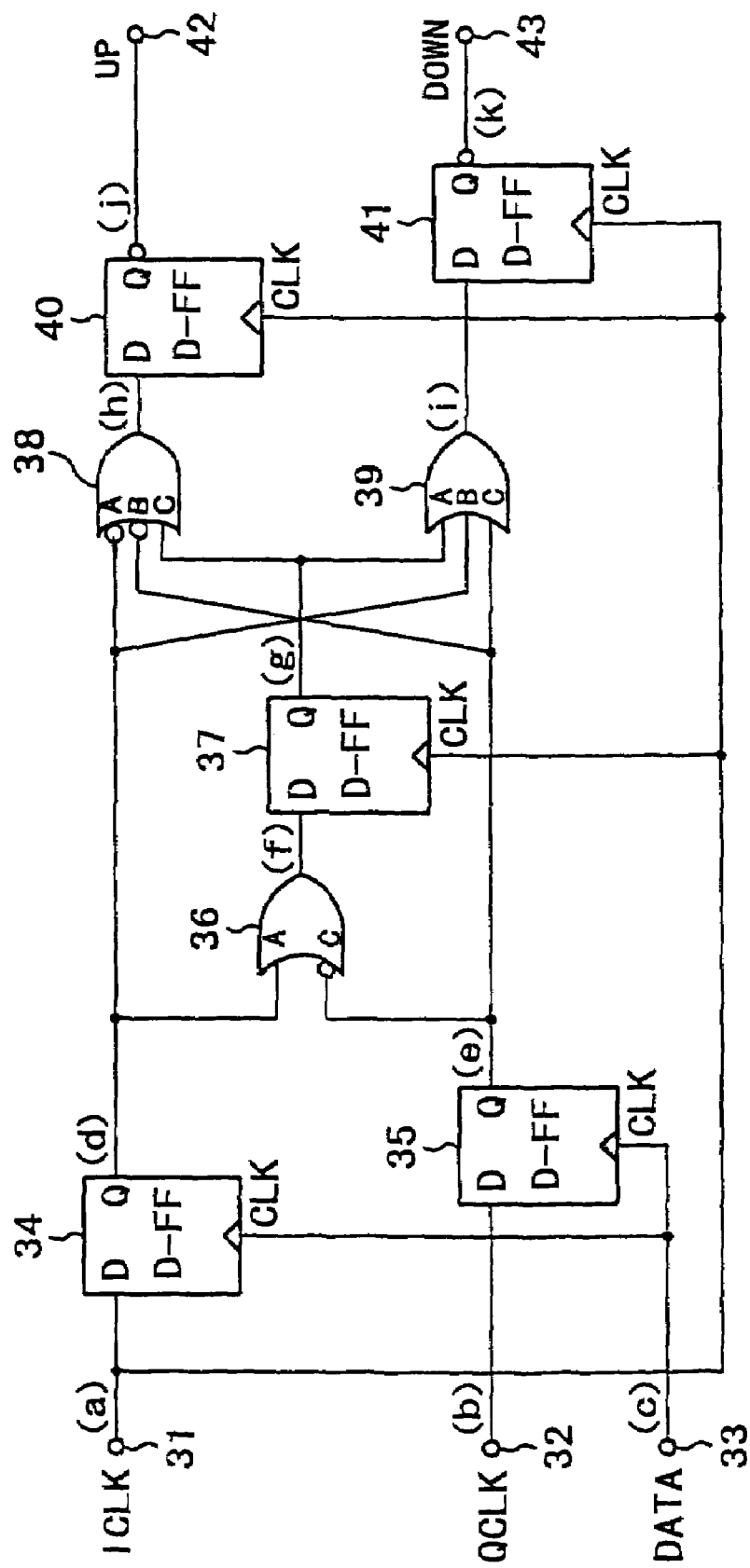
FIG. 6 is a block diagram showing a specific circuit configuration of a frequency detection circuit of the PLL circuit shown in FIG. 5.

FIG. 6 shows a specific circuit configuration of the frequency detection circuit 12 used in the PLL circuit 10 (10') according to the present invention, particularly, an internal configuration of the control logic circuit 126. The circuit configuration of the control logic circuit 126 will be now described.

In FIG. 6, the clock signal ICLK is supplied to an ICLK input terminal 31, and the clock signal QCLK is supplied to a QCLK input terminal 32. In addition, the digital signal DATA of the NRZ waveform is supplied to a data input terminal 33. The ICLK input terminal 31, the QCLK input terminal 32 and the data input terminal 33 used herein respectively are those corresponding to the ICLK input terminal 122, the QCLK input terminal 123 and the data input terminal 121 shown in FIG. 1.

The ICLK input terminal 31 is connected to a D input terminal of a D-FF 34, and the QCLK input terminal 32 is connected to a D input terminal of a D-FF 35. The data input terminal 33 is connected to a CLK terminal of each of the D-FFs 34 and 35. The D-FFs 34 and 35 are respectively those corresponding to the D-FFs 124 and 125 shown in FIG. 1.

Each of the D-FFs 34 and 35 is configured to sample D input data on the leading edge of the clock CLK. In other words, the D-FF 34 provides functions of sampling the clock signal ICLK on the leading edge of the input signal DATA, and the D-FF 35 provides functions of sampling the clock signal QCLK on the leading edge of the input signal DATA.

A Q output terminal of the D-FF 34 is connected to an input terminal A of a dual-input OR gate 36, also to an inverting input terminal A of a three-input OR gate 38 and further to an input terminal B of a three-input OR gate 39. In addition, a Q-output terminal of the D-FF 35 is connected to an inverting input terminal C of the OR gate 36, also to an inverting input terminal B of the OR gate 38 and further to an input terminal C of the OR gate 39.

An output terminal of the OR gate 36 is connected to a D input terminal of a D-FF 37. A CLK input terminal of the D-FF 37 is connected to the ICLK input terminal 31. A Q output terminal of the D-FF 37 is connected to an input terminal C of the OR gate 38 and also to an input terminal A of the OR gate 39.

An output terminal of each of the OR gates 38 and 39 is respectively connected to a D input terminal of each of D-FFs 40 and 41. A CLK input terminal of each of the D-FFs 40 and 41 is respectively connected to the ICLK input terminal 31. A Q output terminal of each of the D-FFs 40 and 41 is respectively connected to each of circuit output terminals 42, 43. The Q output terminal of each of the D-FFs 40 and 41 is an inverting output terminal.

The OR gate 36, the D-FF 37, the OR gates 38 and 39 and D-FFs 40 and 41 are used to configure the control logic circuit 126 shown in FIG. 1. However, it is to be understood that the above circuit configuration is merely given as one embodiment, and hence, the present invention is not limited to the above circuit configuration.

Figure 7:
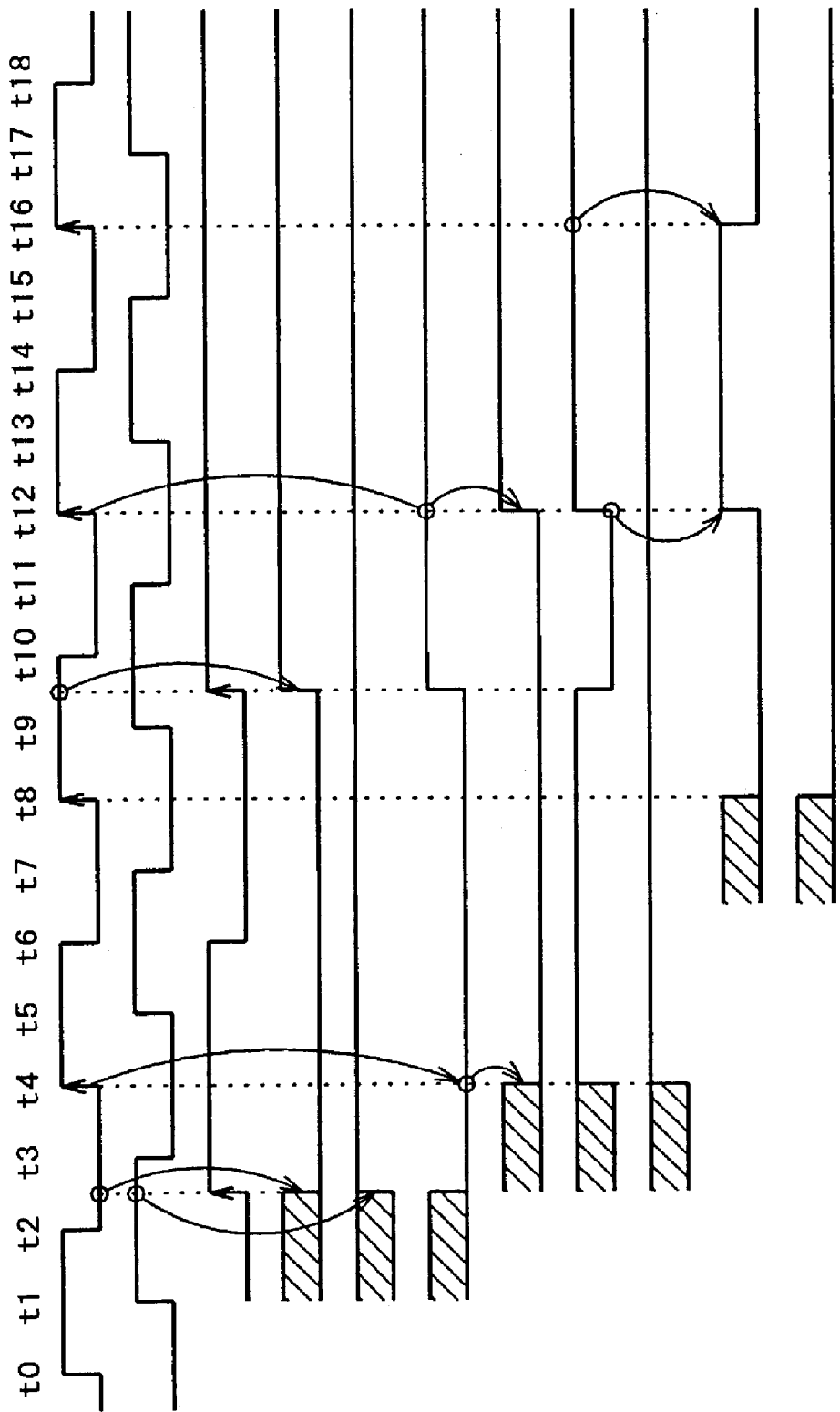
FIG. 7 is a timing chart for illustrating a circuit operation when an UP pulse signal of the frequency detection circuit shown in FIG. 6 is outputted.
Figure 8:
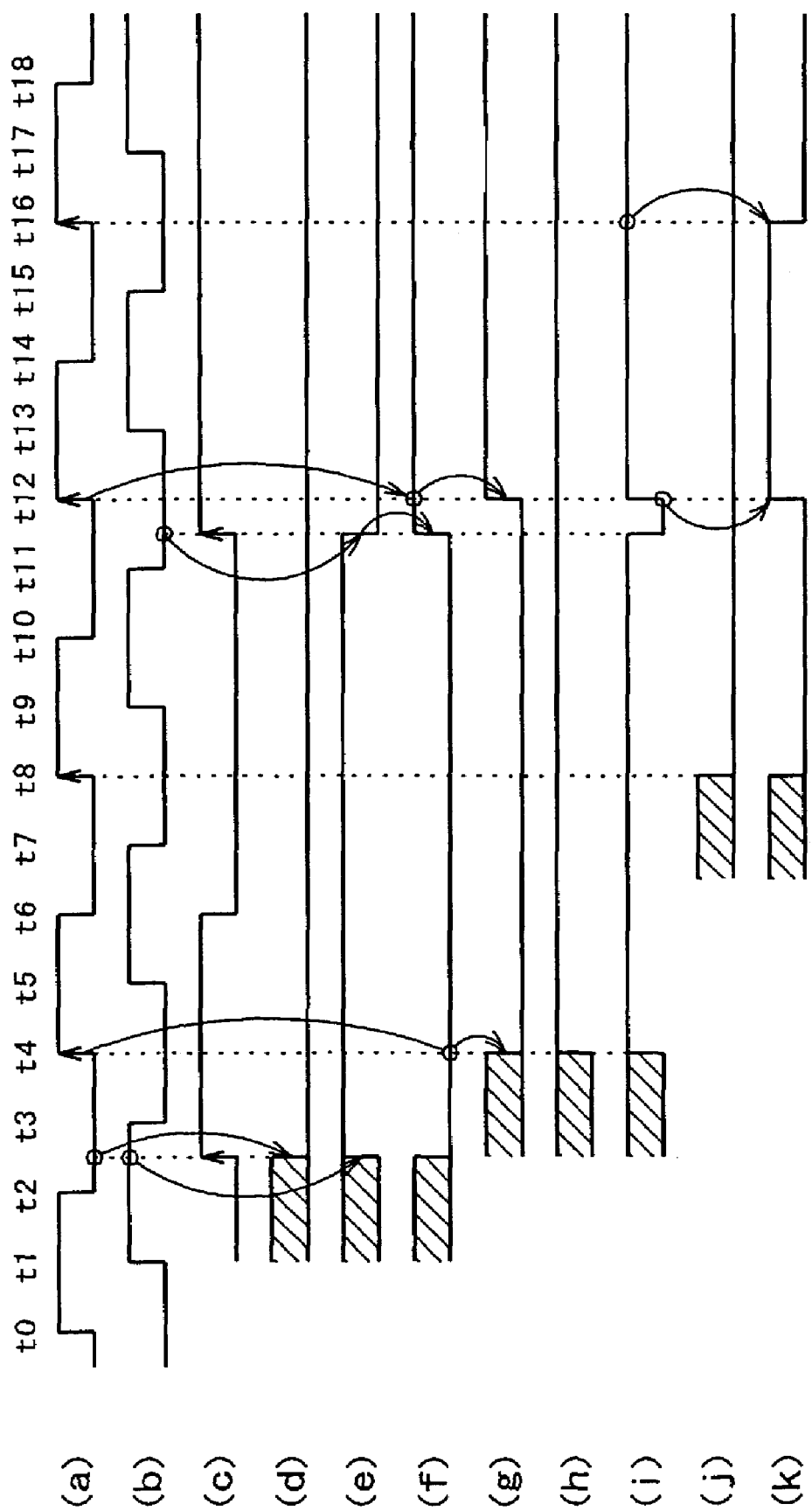
FIG. 8 is a timing chart for illustrating a circuit operation when a DOWN pulse signal of the frequency detection circuit shown in FIG. 6 is outputted.

A circuit operation of the frequency detection circuit having the above configuration will now be described with reference to the timing charts of FIGS. 7 and 8. Incidentally, FIG. 7 is a timing chart when the UP pulse signal is outputted, and FIG. 8 is a timing chart when the DOWN pulse signal is outputted. In addition, reference codes (a) to (k) in the timing charts of FIGS. 7 and 8 respectively represent waveforms as those of nodes shown by reference codes (a) to (k) in FIG. 6.

A circuit operation when the UP pulse signal is outputted will first be described with reference to the timing chart of FIG. 7. Now assume that the waveform of the input signal DATA (c) makes the transition from the "L" level to the "H" level between the points of time t2 and t3, from the "H" level to the "L" level at the point of time close to the point of time t6, from the "L" level to the "H" level between the points of time t9 and t10 and thereafter maintains the "H" level.

The D-FFs 34 and 35 respectively sample clock signals ICLK (a) and QCLK (b) on the leading edge of the waveform of the input signal DATA (c). The clock signals ICLK (a) and QCLK (b) are supposed to be respectively at the "L" level and the "H" level in the period between the points of time t2 and t3, so that sampling these level values in the D-FFs 34 and 35 allows a Q output signal (d) of the D-FF 34 and a Q output signal (e) of the D-FF 35 to respectively become "L" and "H".

The next leading edge of the waveform of the input signal DATA (c) supplied to the CLK terminal of each of the D-FFs 34 and 35 is provided between the points of time t9 and t10, and the clock signals ICLK (a) and QCLK (b) at this point of time are supposed to be respectively of the "H" level. Thus, the Q output signal (d) of the D-FF 34 makes the transition from the "L" level to the "H" level between the points of time t9 and t10.

At this time, the clock signal QCLK (b) is supposed to be at the "H" level, so that the Q output signal (e) of the D-FF 35 is still at the "H" level without the transition of the level thereof. The waveform of the input signal DATA (c) remains unchanged and provides no leading edge of the waveform thereof up to the point of time t16, so that the Q output signals (d) and (e) of the D-FFs 34 and 35 maintain the present levels thereof intact without the transition of the levels thereof.

At the point of time when the input signal DATA (c) is supposed to make the transition between the points of time t2 and t3, the "L" level value of the Q output signal (d) of the D-FF 34 is supplied to the input terminal A of the OR gate 36, and the "H" level value of the Q output signal (e) of the D-FF 35 is supplied to the inverting input terminal B of the OR gate 36, so that an output signal (f) of the OR gate 36 becomes "L". In addition, the transition of the input signal DATA (c) from the "L" level to the "H" level at the next change point thereof occurs between the points of time t9 and t10.

When the input signal DATA (c) makes the transition from the "L" level to the "H" level between the point of time t9 and t10, the Q output signal (d) of the D-FF 34 also makes the transition from the "L" level to the "H" level, whereas the Q output signal (e) of the D-FF 35 is still at the "H" level, so that an output signal (f) of the OR gate 36 makes the transition from the "L" level to the "H" level. Thereafter, the waveform of the input signal DATA (c) remains unchanged up to the point of time t16, so that the output signal (f) of the OR gate 36 maintains the "H" level.

The output signal (f) of the OR gate 36 is supplied to a D input terminal of a D-FF 37. The clock signal ICLK (a) is supplied to the D-FF 37 as CLK input thereof, differently from the case of the D-FFs 34 and 35. This allows the D-FF 37 to sample the output signal (f) of the OR gate 36 as the D input thereof on the leading edge of the clock signal ICLK (a).

In other words, the output signal (f) of the OR gate 36 is sampled in the D-FF 37 at the point of time t4 on the leading edge of the clock signal ICLK (a), so that an output signal (g) thereof becomes "L". In addition, the output signal (f) of the OR gate 36 is supposed to be at the "L" level at the point of time t8 on the next leading edge of the clock signal ICLK (a), so that the Q output signal (g) of the D-FF 37 maintains the "L" level without the transition of the level thereof.

Further, the output signal (f) of the OR gate 36 is supposed to be at the "H" level at the point of time t12 on the leading edge of the clock signal ICLK (a), so that the output signal (g) of the D-FF 37 makes the transition from the "L" level to the "H" level. In addition, the output signal (f) of the OR gate 36 is supposed to still be at the "H" level at the point of time t16 likewise, so that the output signal (g) of the D-FF 37 is also at the "H" level and maintains the "H" level on and after the point of time t16.

The Q output signal (d) of the D-FF 34, the Q output signal (e) of the D-FF 35 and the Q output signal (g) of the D-FF 37 are respectively supplied to the inverting input terminal A, the inverting input terminal B and the input terminal C of the three-input OR gate 38.

It is assumed that an inverted signal of the Q output signal (d) of the D-FF 34 is at the "H" level in the period between the leading edge of the input signal DATA between the points of time t2 and t3 and the leading edge of the input signal DATA between the points of time t9 and t10 and then maintains the "L" level on and after the above point of time on the leading edge between the points of time t9 and t10, an inverted signal of the Q output signal (e) of the D-FF 35 maintains the "L" level on and after the point of time on the leading edge of the input signal DATA between the points of time t2 and t3, and the Q output signal (g) of the D-FF 37 is at the "L" level in the period between the point of time t4 and t12 and then maintains the "H" level on and after the point of time t12. Thus, an output signal (h) of the OR gate 38 is supposed to be at the "H" level in the period between the point of time t4 and the leading edge of the input signal DATA between the points of time t9 and t10, and the "L" level in the period between the leading edge of the input signal DATA between the points of time t9 and t10 and the point of time t12 and then maintains the "H" level on and after the point of time t12.

On the one hand, the Q output signal (g) of the D-FF 37, the Q output signal (d) of the D-FF 34 and the Q output signal (e) of the D-FF 35 are respectively supplied to the input terminals A, B and C of the three-input OR gate 39.

It is assumed that the Q output signal (d) of the D-FF 34 is at the "L" level in the period between the leading edge of the input signal DATA between the points of time t2 and t3 and the leading edge of the input signal DATA between the points of time t9 and t10, and then maintains the "H" level on and after the point of time on the leading edge of the input signal DATA between the points of time t9 and t10, the Q output signal (e) of the D-FF 35 maintains the "H" level on and after the point of time on the leading edge of the input signal DATA between the points of time t2 and t3, and the Q output signal (g) of the D-FF 37 is at the "L" level in the period between the points of time t4 and t12 and then maintains the "H" level on and after the point of time t12. Thus, the output signal (i) of the OR gate 39 is supposed to maintain the "H" level on and after the point of time t4.

The output signal (h) of the OR gate 38 is supplied to a D input terminal of a D-FF 40. The D-FF 40 samples the output signal (h) of the OR gate 38 as the D input data synchronously with the clock signal ICLK (a). In other words, the "H" level value of the output signal (h) of the OR gate 38 is sampled in the D-FF 40 at the point of time t8 on the leading edge of the clock signal ICLK (a).

This allows an inverted Q output signal (j) of the D-FF 40 to become "L". The time t12 is the point of time on the next leading edge of the clock signal ICLK (a), and the output signal (h) of the OR gate 38 is supposed to be at the "L" level at this point of time, so that the inverted Q output signal (j) of the D-FF 40 makes the transition from the "L" level to the "H" level. In addition, the time t16 is the point of time on the further next leading edge of the clock signal ICLK (a), and the output signal (h) of the OR gate 38 is supposed to be at the "H" level at this point of time, so that the inverted Q output signal (j) of the D-FF 40 makes the transition from the "H" level to the "L" level. The inverted Q output signal (j) of the D-FF 40 is used as the UP pulse signal, which is then supplied from the circuit output terminal 42 to the next-stage charge pump circuit (the charge pump circuit 14 in FIG. 1).

On the one hand, the output signal (i) of the OR gate 39 is supplied to a D input terminal of a D-FF 41. The clock signal ICLK (a) is also supplied to the D-FF 41 as the D input thereof, so that the D input data in the D-FF 41 may be sampled at the same time as in the D-FF 40. In other words, the output signal (i) of the OR gate 39 is supposed to be at the "H" level at the point of time t8, so that an inverted Q output signal (k) of the D-FF 41 becomes "L".

In addition, the output signal (i) of the OR gate 39 is supposed to be also at the "H" level at the points of time t12 and t16 on the next leading edges of the clock signal ICLK (a), so that the inverted Q output signal (k) of the D-FF 41 maintains the "L" level. The inverted Q output signal (k) of the D-FF 41 is used as the DOWN pulse signal, which is then supplied through the circuit output terminal 43 to the next-stage charge pump circuit (the charge pump circuit 14 in FIG. 1).

A circuit operation in a case where the DOWN pulse signal is outputted will be now described with reference to the timing chart of FIG. 8. Now assume that the waveform of the input signal DATA makes the transition from the "L" level to the "H" level between the points of time t2 and t3, from the "H" level to the "L" level at the point of time close to the point of time t6, from the "H" level to the "L" level again between the points of time t11 and t12, and maintains the "H" level on and after the point of time t12.

The D-FFs 34 and 35 respectively sample the D input data, that is, the clock signals ICLK (a) and QCLK (b) on the leading edge of the waveform of the input signal DATA (c). The clock signals ICLK (a) and QCLK (b) are supposed to be respectively at the "L" level and the "H" level in the period between the points of time t2 and t3, so that sampling these level values in the D-FFs 34 and 35 allows the Q output signal (d) of the D-FF 34 and the Q output signal (e) of the D-FF 35 to become "L" and "H" respectively.

The next leading edge of the waveform of the input signal DATA (c) supplied to the CLK terminal of each of the D-FFs 34 and 35 is provided between the points of time t11 and t12, so that the clock signals ICLK (a) and QCLK (b) at this point of time are supposed to be respectively at the "L" level. Thus, the Q output signal (d) of the D-FF 34 maintains the "L" level.

On the one hand, the clock signal QCLK (b) is supposed to be also at the "L" level in the period between the points of time t11 and t12, so that the Q output signal (e) of the D-FF 35 makes the transition from the "H" level to the "L" level. Thereafter, the waveform of the input signal DATA (c) remains unchanged and provides no leading edge of the waveform thereof, so that the Q output signals (d) and (e) of the D-FFs 34 and 35 maintain the present levels thereof intact without the transition of the levels thereof.

When the input signal data (c) makes the transition between the points of time t2 and t3, the "L" level value of the Q output signal (d) of the D-FF 34 is supplied to the input terminal A of the OR gate 36, and the "L" level value of the Q output signal (e) of the D-FF 35 is supplied to the inverting input terminal B of the OR gate 36, so that the output signal (f) of the OR gate 36 becomes "L". In addition, the transition of the input signal DATA (c) from the "L" level to the "H" level at the next change point thereof occurs between the points of time t11 and t12.

When the input signal DATA (c) makes the transition from the "L" level to the "H" level between the points of time t11 and t12, the Q output signal (e) of the D-FF 35 makes the transition from the "H" level to the "L" level, whereas the Q output signal (d) of the D-FF 34 is still at the "L" level, so that the output signal (f) of the OR gate 36 makes the transition from the "L" level to the "H" level. Thereafter, the waveform of the input signal DATA (c) remains unchanged, so that the output signal (f) of the OR gate 36 maintains the "H" level.

The output signal (f) of the OR gate 36 is supplied to the D input terminal of the D-FF 37. Differently from the input signal DATA supplied to the CLK terminals of the D-FFs 34 and 35, the clock signal ICLK (a) is supplied to the D-FF 37 as the CLK input thereof. This allows the D-FF 37 to sample the output signal (f) of the OR gate 36, that is, the D input thereof, on the leading edge of the clock signal ICLK (a).

In other words, the output signal (f) of the OR gate 36 is sampled in the D-FF 37 at the point of time t4 on the leading edge of the clock signal ICLK (a), so that the output signal (g) thereof becomes "L". In addition, the output signal (f) of the OR gate 36 is supposed to be at the "L" level at the point of time t8 on the next leading edge of the clock signal ICLK (a), so that the output signal (g) of the D-FF 37 maintains the "L" level without the transition of the level thereof.

Further, the output signal (f) of the OR gate 36 is supposed to be at the "H" level at the point of time t12 on the leading edge of the clock signal ICLK (a), so that the output signal (g) of the D-FF 37 makes the transition from the "L" level to the "H" level. In addition, the output signal (f) of the OR gate 36 is supposed to be at the "H" level at the point of time t16 likewise, so that the output signal (g) of the D-FF 37 is also at the "H" level and maintains the "H" level on and after the point of time t16.

The Q output signal (d) of the D-FF 34, the Q output signal (e) of the D-FF 35 and the Q output signal (g) of the D-FF 37 are respectively supplied to the inverting input terminal A, the inverting input terminal B and the input terminal C of the three-input OR gate 38.

It is assumed that the inverted signal of the Q output signal (d) of the D-FF 34 is at the "H" level in the period between the leading edge of the input signal DATA between the points of time t2 and t3 and the point of time t18, the inverted signal of the Q output signal of the D-FF 35 is at the "L" level in the period between the leading edge of the input signal DATA between the points of time t2 and t3 and the point of time between the points of time t11 and t12, and then maintains the "H" level on and after the transition from the "H" level to the "L" level, and the Q output signal (g) of the D-FF 37 is at the "L" level in the period between the points of time t4 and t12, and then maintains the "H" level on and after the point of time t12. Thus, the output signal (h) of the OR gate 38 is supposed to maintain the "H" level on and after the point of time t4.

On the one hand, the Q output signal (g) of the D-FF 37, the Q output signal (d) of the D-FF 34 and the Q output signal (e) of the D-FF 35 are respectively supplied to the input terminals A, B and C of the three-input OR gate 39.

It is assumed that the Q output signal (d) of the D-FF 34 maintains the "L" level on and after the point of time on the leading edge of the input signal DATA between the points of time t2 and t3, the Q output signal (e) of the D-FF 35 is at the "H" level in the period between the leading edge of the input signal DATA between the points of time t2 and t3 and the leading edge of the input signal DATA between the points of time t11 and t12 and then maintains the "L" level on and after the point of time t12, and the Q output signal (g) of the D-FF 37 is at the "L" level in the period between the points of time t3 and t12, and then maintains the "H" level on and after the point of time t12. Thus, the output signal (i) of the OR gate 39 is supposed to be at the "H" level in the period between the point of time t4 and the leading edge of the input signal DATA between the points of time t11 and t12, and the "L" level in the period between the leading edge of the input signal DATA between the points of time t11 and t12 and the point of time t12. Further, the output signal (i) of the OR gate 39 maintains the "H" level on and after the point of time t12.

The output signal (h) of the OR gate 38 is supplied to the D input terminal of the D-FF 40. The D-FF 40 samples the output signal (h) of the OR gate 38, that is, the D input data, synchronously with the clock signal ICLK (a). In other words, the "H" level value of the output signal (h) of the OR gate 38 is sampled in the D-FF 40 at the point of time t8 on the leading edge of the clock signal ICLK (a).

This allows the inverted Q output signal (j) of the D-FF 40 to become "L". The times t12 and t16 are the point of time on the next leading edges of the clock signal ICLK (a), and the output signal (h) of the OR gate 38 at this point of time is supposed to be at the "H" level, so that the inverted Q output signal (j) of the D-FF 40 maintains the "L" level.

On the one hand, the output signal (i) of the OR gate 39 is supplied to the D input terminal of the D-FF 41. The clock signal ICLK (a) is also supplied to the D-FF 41 as the D input thereof, so that the D input data in the DFF 41 may be sampled at the same time as in the D-FF 40. In other words, the output signal (i) of the OR gate 39 is supposed to be at the "H" level at the point of time t8, so that an inverted Q output signal (k) of the D-FF 41 becomes "L".

In addition, the output signal (i) of the OR gate 39 is supposed to be at the "L" level at the point of time t12 on the next leading edge of the clock signal ICLK (a), so that the inverted output signal (k) of the D-FF 41 makes the transition from the "L" level to the "H" level. Further, the output signal (i) of the OR gate 39 is supposed to be at the "H" level at the point of time t16, so that the inverted Q-output signal (k) of the D-FF 41 makes the transition from the "H" level to the "L" level. The inverted Q output signal (k) of the D-FF 41 is used as the DOWN pulse signal, which is then supplied through the circuit output terminal 43 to the next-stage charge pump circuit (the charge pump circuit 14 shown in FIG. 1).

As described above, the UP pulse signal (j) equivalent to the inverted Q output signal of the D-FF 40 maintains the "L" level in the period between the points of time t8 and t18, while the DOWN pulse signal (k) equivalent to the inverted Q output signal of the D-FF 41 maintains the "H" level in the period between the points of time t12 and t16, so that a current control on the next-stage charge pump circuit 14 takes place, resulting in the generation of the control voltage to the VCO 16.

In view of the above, the circuit operation of the frequency detection circuit of FIG. 6 will be summarized as follows. Sampling (ICLK, QCLK)=(1,1) at the point of time on the leading edge of the input signal DATA followed by a certain point of time on the leading edge thereof at which (ICLK, QCLK)=(0, 1) is supposed to be sampled provides output of the UP pulse signal whose length is equivalent to a period of the clock signal ICLK. In other words, in the presence of m (m being an optional integer)-bit data in the period between the two leading edges of the input signal DATA, the clock signal ICLK in the period between the two leading edges of the input signal DATA is supposed to be present in not more than m cycles, so that the pulse of the UP pulse signal is generated to set the frequency of the clock signal ICLK higher.

Alternatively, sampling (ICLK, QCLK)=(0,0) at the point of time on the leading edge of the input signal DATA followed by a certain period of time on the leading edge of the input signal DATA at which (0, 1) is supposed to be sampled provides output of the DOWN pulse signal whose length is equivalent to a period of the clock signal ICLK. In other words, in the presence of m' (m' being an optional integer)-bit data in the period between the two leading edges of the input signal DATA, the clock signal ICLK in the period between the two leading edges thereof is supposed to be present in not more than m' cycles, so that the pulse of the DOWMN pulse signal is generated to set the frequency of the clock signal ICLK lower.

In the absence of the duty distortion in the input signal DATA, when the complete coincidence in frequency between the clock signal ICLK and the input signal DATA is provided, the frequency detection circuit keeps sampling one of (0, 0), (0, 1), (1, 0) and (1, 1) at the point of time on the leading edge of the input signal DATA, thereby eliminating the generation of the pulse of the UP pulse signal or the DOWN pulse signal.

Figure 9:
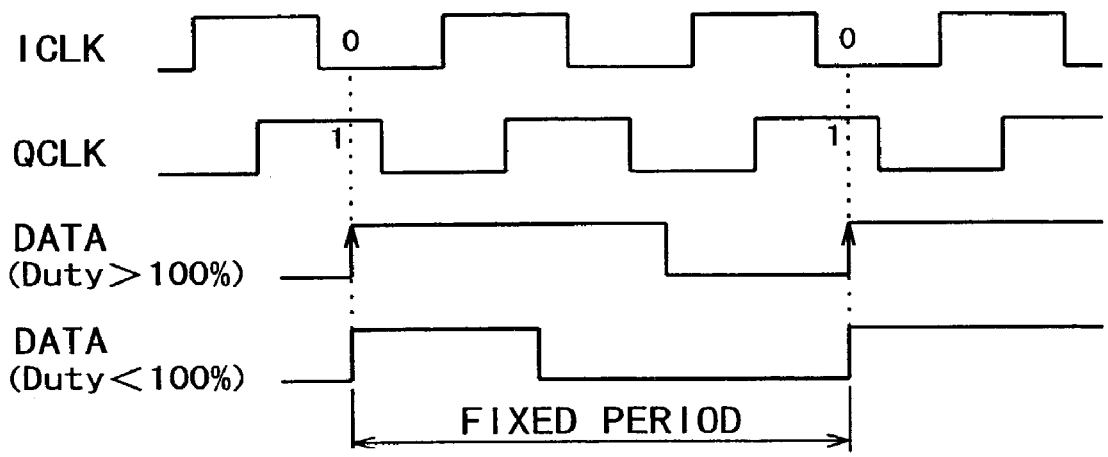
FIG. 9 is a timing chart for illustrating a circuit operation in the presence of a duty distortion in an input signal DATA.

Even in the presence of the duty distortion in the input signal DATA, when the complete coincidence in frequency between the clock signal ICLK and the input signal DATA is provided, the level values of the clock signals ICLK and QCLK are sampled only on the leading edge of the input signal DATA, so that a fixed combination of the sampled values thereof may be provided at all times as shown in the timing chart of FIG. 9.

Incidentally, the frequency detection circuit 12 according to the present embodiment is configured to sample the "L" level value (the logic value "0") of the clock signal ICLK and the "H" level value (the logic value "1") of the clock signal QCLK on the leading edge of the serial input signal DATA. Alternatively, other logic combinations may be also used as desired. However, when the logic combination according to the present embodiment is used, a location of the logic combination is supposed to be at the substantial center of the individual period of the input signal DATA, so that the phase adjustment followed by the frequency adjustment may be controlled at the point of time close to the center of the individual period of the input signal DATA, thereby offering the advantages of providing a wider control range for the phase control.

In addition, the frequency detection circuit 12 according to the present embodiment is also configured to sample the level values of the clock signals ICLK and QCLK only on the leading edge of the input signal DATA. Alternatively, the level values of the clock signals ICLK, QCLK may be also sampled only on the trailing edge of the input signal DATA. Sampling on the trailing edge of the input signal DATA also eliminates the generation of the wrong control signal (the UP pulse signal and the DOWN pulse signal), thereby providing a stable PLL operation.

Figure 10:
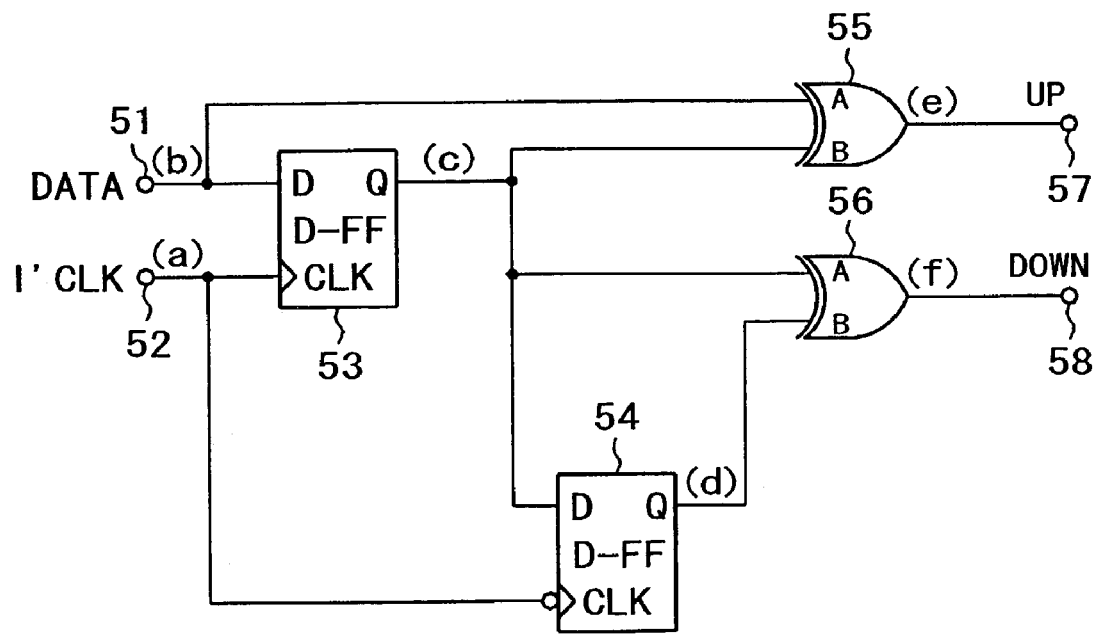
FIG. 10 is a block diagram showing a specific circuit configuration of a phase detection circuit of the PLL circuit shown in FIG. 1 or 5.

The phase detection circuit 11 used in the PLL circuit 10 (10') according to the present invention will be now described. FIG. 10 shows one embodiment of a circuit configuration thereof. The circuit configuration of the phase detection circuit 11 will first be described.

In FIG. 10, a data input terminal 51 to which the input signal DATA is supplied is connected to a D input terminal of a D-FF 53 and also to one input terminal A of a dual-input exclusive OR (hereinafter referred to as EX-OR) gate 55. On the one hand, a CLK terminal 52 to which the clock signal I'CLK generated in the clock generator 17 is supplied is connected to a CLK terminal of the D-FF 53 and also to an inverting CLK terminal of a D-FF 54.

A Q output terminal of the D-FF 53 is connected to the other input terminal B of the EX-OR gate 55 and also to one input terminal A of a dual-input EX-OR gate 56 and a D input terminal of the D-FF 54. A Q output terminal of the D-FF 54 is connected to the other input terminal B of the EX-OR gate 56. An output terminal of the EX-OR gate 55 is connected to an UP output terminal 57, and an output terminal of the EX-OR gate 56 is connected to a DOWN output terminal 58.

Figure 11:
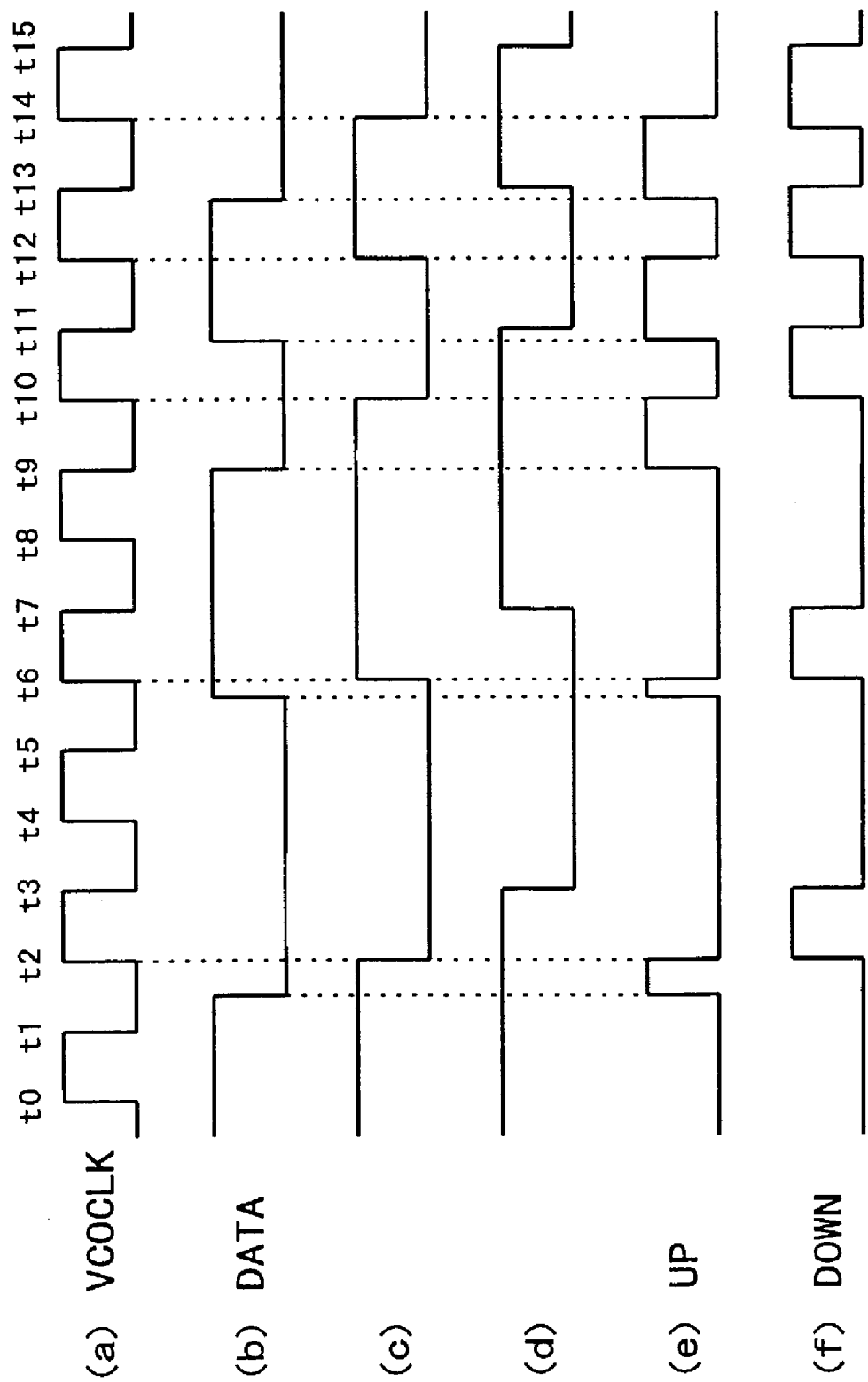
FIG. 11 is a timing chart for illustrating a circuit operation of the phase detection circuit shown in FIG. 10.

A circuit operation of the phase detection circuit 11 having the above configuration will now be described with reference to the timing charge of FIG. 11. Incidentally, reference codes (a) to (f) shown in the timing chart of FIG. 11 respectively represent waveforms as those of nodes shown by reference codes (a) to (f) in FIG. 10.

Now assume that the times t0, t2, t4, t6, t8, t10, t12 and t14 are the points of time on the leading edge of a clock signal I'CLK (a) supplied from the clock generator (See FIG. 1) through the CLK input terminal 52, while the times t1, t3, t5, t7, t9, till, t13 and t15 are the points of time on the trailing edge thereof.

It is also assumed that the waveform of the input signal DATA (b) is at the "L" level in the period between the trailing edge between the points of time t1 and t2 and the leading edge between the points of time t5 and t6, and then maintains the "H" level up to the point of time on the trailing edge between the points of time t8 and t9, the "L" level up to the point of time on the leading edge between the points of time t10 and t11, the "H" level up to the point of time on the trailing edge between the points of time t12 and t13, and thereafter, the "L" level up to the point of time t15.

The "L" level value of the input signal DATA (b) is sampled in the D-FF 53 at the point of time t2 on the leading edge of the clock signal I'CLK (a). This allows the Q output signal (c) of the D-FF 53 to make the transition from the "H" level to the "L" level. The input signal DATA is supposed to be at the "L" level without the transition of the level thereof at the point of time t4 on the next leading edge of the clock signal I'CLK, so that the Q output signal (c) of the D-FF 53 also maintains the "L" level without the transition of the level thereof.

The input signal DATA is supposed to be at the "H" level at the point of time t6 on the next leading edge of the clock signal I'CLK (a), so that the Q output signal (c) of the D-FF 53 makes the transition from the "L" level to the "H" level. In addition, the input signal DATA is supposed to be at the "H" level at the point of time t8 on the leading edge of the clock signal I'CLK, and the "H" level value thereof is sampled, so that the Q output signal (c) of the D-FF 53 is still of the "H" level without the transition of the level thereof.

When the point of time t10 comes, the input signal DATA is supposed to already be at the "L" level, so that the Q output signal (c) of the D-FF 53 also makes the transition from the "H" level to the "L" level. When the point of time t12 comes, the input signal DATA is supposed to be at the "H" level, so that the Q output signal (c) of the D-FF 53 makes the transition from the "L" level to the "H" level. The input signal DATA is supposed to already be at the "H" level at the point of time t14 on the next leading edge of the clock signal I'CLK. This allows the D-FF 53 to sample the "L" level value thereof, so that the Q output signal (c) thereof makes the transition from the "H" level to the "L" level.

On the one hand, the inverted clock of the clock signal I'CLK (a) is supplied to the D-FF 54 as CLK input thereof. Thus, the D-FF 54 is supposed to sample the input signal DATA at the points of time t1, t3, t5, t7, t9, t11, t13 and t15 on the trailing edges of the clock signal I'CLK (a).

The Q output signal (c) of the D-FF 53 is supposed to be at the "H" level at the point of time t1, so that the Q output signal (d) of the D-FF 54 becomes "H" and maintains the "H" level up to the point of time t3 on the next trailing edge of the clock signal I'CLK (a). When the point of time t3 comes, the Q output signal (c) of the D-FF 53 is supposed to be at the "L" level, sampling the "L" level value thereof allows the Q output signal (d) of the D-FF 54 to make the transition from the "H" level to the "L" level. Then, the output signal (d) thereof keeps the "L" level up to the point of time immediately before the point of time t7 after going through the point of time t7.

The Q output signal (c) of the D-FF 53 is supposed to be at the "H" level at the point of time t7 on the trailing edge of the clock signal I'CLK (a), so that sampling the "H" level value thereof allows the Q output signal (d) of the D-FF 54 to make the transition from the "L" level to the "H" level. The level value of the Q output signal (c) of the D-FF 53 remains unchanged at the point of time t9, whereas it makes the transition from the "H" level to the "L" level at the point of time t10 and then maintains the "L" level up to the point of time t12. The Q output signal (c) of the D-FF 53 is supposed to be at the "L" level at the point of time t11, and the D-FF 54 samples the "L" level value thereof, so that the Q output signal (d) thereof makes the transition from the "H" level to the "L" level.

The Q output signal (c) of the D-FF 53 is supposed to be at the "H" level at the point of time t13, and the D-FF 54 samples the "H" level value thereof, so that the Q output signal (d) thereof makes the transition from the "L" level to the "H" level. In addition, the Q output signal (d) maintains the "H" level up to the point of time t15 on the next trailing edge of the clock signal I'CLK, the "L" level value of the Q output signal (c) of the D-FF 53 is sampled in the D-FF 54 at this point of time. This allows the Q output signal (d) of the D-FF 54 to make the transition from the "H" level to the "L" level.

An operation of the EX-OR gate 55 that generates the UP pulse signal (e) will be now described with reference to the timing chart of FIG. 11. Incidentally, assume that the input signal DATA (b) and the Q output signal (c) of the D-FF 53 are respectively supplied to the input terminals A and B of the EX-OR gate 55.

The period in which the input signal DATA (b) is different in logic value from the Q output signal (c) of the D-FF 53 is supposed to be one between the point of time at which the input signal DATA (b) is supposed to make the transition from the "H" level to the "L" level between the points of time t1 and t2 and the point of time t2 at which the Q output signal (c) of the D-FF 53 is supposed to be of the "H" level, one between the point of time at which the input signal DATA (b) is supposed to make the transition from the "L" level to the "H" level between the points of time t5 and t6 and the point of time t6 at which the Q output signal (c) of the D-FF 53 is supposed to make the transition from the "L" level to the "H" level, one between the point of time at which the input signal DATA (b) is supposed to make the transition from the "H" level to the "L" level between the points of time t8 and t9 and the point of time t10, one between the point of time at which the input signal DATA (b) is supposed to make the transition from the "L" level to the "H" level between the points of time t10 and t11 and the point of time t12 and one between the point of time at which the input signal DATA (b) is supposed to make the transition from the "H" level to the "L" level between the points of time t12 and the t13 and the point of time t14.

Then, the output signal (e) of the EX-OR gate 55 is supposed to be at the "H" level in the above periods. Alternatively, the input signal DATA (b) and the Q output signal (c) of the D-FF 53 are supposed to be respectively at the "H" level or the "L" level in the periods other than the above periods, so that the output signal (e) of the EX-OR gate 55 becomes "L". The output signal (e) of the EX-OR gate 55 is adapted for the UP pulse signal.

An operation of the EX-OR gate 56 that generates the DOWN pulse signal will be now described with reference to the timing chart of FIG. 11. Incidentally, assume that the Q output signal (c) of the D-FF 53 and the Q output signal (d) of the D-FF 54 are respectively supplied to the input terminals A and B of the EX-OR gate 56.

The period in which the Q output signal (c) of the D-FF 53 is different in logic value from the Q output signal (d) of the D-FF 54 is supposed to be one between the points of time t2 and t3, one between the points of time t6 and t7, one between the points of time t10 and t11, one between the points of time t12 and t13 and one between the points of time t14 and t15.

Then, the output signal (f) of the EX-OR gate 56 is supposed to be at the "H" level in the above periods. Alternatively, the Q output signal (c) of the D-FF 53 and the Q output signal (d) of the D-FF 54 are supposed to be respectively at the "H" level or the "L" level in the periods other than the above periods, so that the output signal (f) of the EX-OR gate 56 becomes "L". The output signal (f) of the EX-OR gate 56 is adapted for the DOWN pulse signal.

As described above, the pulse waveforms of the UP pulse signal (e) and the DOWN pulse signal (f) are respectively generated at the time of every transition of the input signal DATA. The circuit configuration described above is adaptable to provide the constant pulse width for the DOWN pulse signal (f), so that the phase control may take place by adjusting the pulse width of the UP pulse signal (e).

In the absence of the duty distortion in the input signal DATA, when the operation of the frequency detection circuit 12 proceeds to a point close to the point at which the phase locking to a specific frequency is provided, the phase detection circuit 11 starts the operation while the frequency detection circuit 12 is in operation. Thus, the operation of the phase detection circuit 11 as described above provided the phase locking such that the point of time on the leading edge at which the clock signal I'CLK is supposed to make the transition from the "L" level to the "H" level may be at the center of the width of the pulse (waveform) of the input signal DATA in particular.

Now assume that the duty distortion occurs in the input signal DATA. From the above description it is proved that using the frequency detection circuit 12 having the circuit configuration shown in FIG. 6 provides a correct frequency detection, regardless of the presence of the duty distortion in the input signal DATA. In the duration of the correct frequency detection as described above, the phase detection circuit 11 provides the stable (locked) state at the point of time when a pulses width sum of the UP pulse signal in an optional period becomes equal to that of the DOWN pulse signal. The point of time on the leading edge of the clock signal I'CLK is supposed to also be positioned at the center of the eye pattern of the input signal DATA, regardless of the presence of the stable state.

An embodiment of the clock signals subjected to phase locking will be now described with reference to the timing chart of FIG. 12. In the timing chart of FIG. 12, a reference code (a) represents the waveform of the input signal (NRZ waveform) DATA when the Duty=100%, (b) represents the waveform of the input signal DATA when the Duty>100%, (c) represents the waveform of the input signal DATA when the Duty<100%, (d) represents the waveform of the clock signal ICLK, (e) represents the waveform of the clock signal QCLK and (f) represents the waveform of the clock signal I'CLK.

Figure 12:
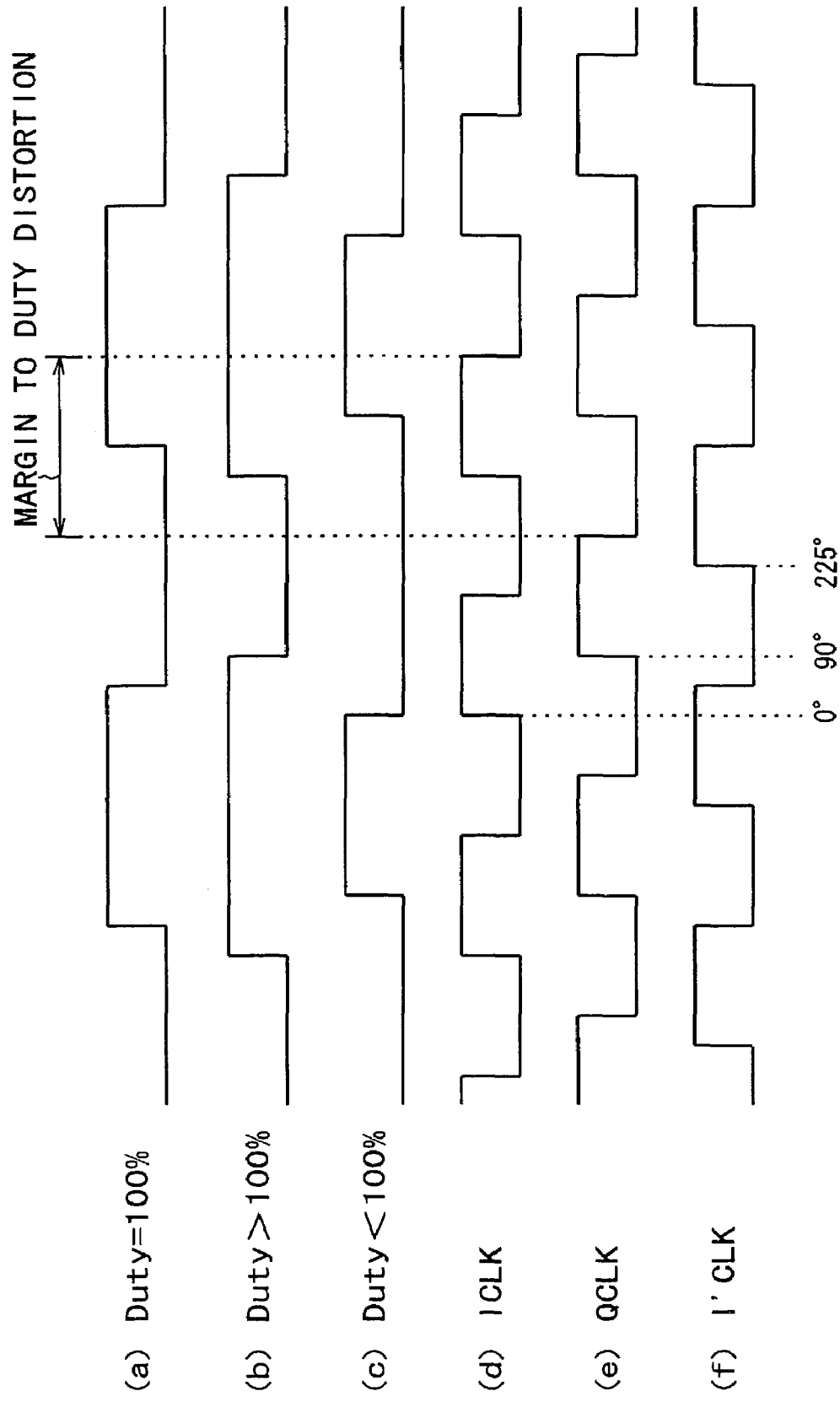
FIG. 12 is a timing chart showing a timing relation provided in a phase locked state.

It is proved from the timing chart of FIG. 12 that the clock signal I'CLK (f) is provided such that the point of time on the leading edge thereof is positioned at the center of the waveform (the width) of the input signal DATA (a) when Duty=100%, and is also phase-locked to the center of the waveform (width) of each of the input signal DATA (b) when the Duty>100% and the input signal DATA (c) when the Duty<100%.

As described above, regardless of pulse width variations of the input signal DATA depending on the duty distortion thereof, the point of time on the leading edge of the clock signal I'CLK (f) is supposed to be positioned at the center of the "H" level period (the pulse width) of the input signal DATA as long as the phase locked state is provided.

As has been described in the related art, the phase detection circuit is applied to position the point of time on the leading edge of the clock signal ICLK at the center of the eye pattern of the input signal DATA. In addition, when the phase detection circuit is used to sample the level values of the clock signals ICLK and QCLK at the change point of the input signal DATA, the frequency detection circuit is supposed to provide the unstable sampled value of the clock signal ICLK in proportion as the duty distortion of the input signal DATA in the locked state is varied.

On the other hand, according to the present invention, the clock signal I'CLK (f) whose phase is delayed by an optional phase limited to the range from more than 180 degrees to less than 270 degrees, preferably 225 degrees, for instance, to the clock signal ICLK (d) is generated on the basis of the oscillation frequency clock VCOCLK of the VCL 16, and the phase detection circuit 11 is used to position the point of time on the leading edge (the change point) of the clock signal I'CLK at the center of the eye pattern of the input signal DATA for the duration of the phase locked state, thereby providing an increased phase control proof to the duty distortion as follows.

In other words, from the timing chart of FIG. 12 it is proved that the leading edge of the clock signal I'CLK (f) is positioned between the trailing edges of the clock signals ICLK (d) and QCLK (e), so that the point of time on the leading edge of the input signal DATA (Duty=100%) is positioned at the center of (ICLK, QCLK)=(1,0).

Thus, when a pulling of the frequency is completed, the frequency detection circuit 12 is supposed to sample (ICLK, QCLK)=(1, 0) at all times, thereby eliminating the possibility that the window for generating the frequency control signal (the UP pulse signal and the DOWN pulse signal) is opened. In addition, even if the point of time on the leading edge of the input signal DATA varies depending on the duty distortion such as to provide the combination pattern of the logic values of (ICLK, QCLK) in excess of (ICLK, QCLK)= (1, 0), the frequency detection circuit 12 is supposed to sample (ICLK, QCLK)=(0, 0) or (1,1), thereby also eliminating the possibility that the window is opened. As a result, a margin to the duty distortion becomes within the range in which the logic level combination patterns (ICLK, QCLK) are (0,0), (1,0) and (1,1), in other words, 270 degrees (that is, ±135 degrees).

If the clock signal I'CLK is set to have a phase relation with the clock signal ICLK such that the phase of the clock signal I'CLK is delayed by the optional phase limited to the range from more than 0 degree to less than 90 degrees, preferably 45 degrees, for instance, to the clock signal ICLK, the point of time on the leading edge of the input signal DATA (Duty=100%) is positioned at the center of (ICLK, QCLK=(0, 1). In this case, the window for generating the frequency control pulse (the UP pulse signal and the DOWN pulse signal) is supposed to be opened in the frequency detection circuit 12 for sampling (ICLK, QCLK)= (0, 1). Whenever the pulling of the frequency is completed, the frequency detection circuit 12 is, however, supposed to sample (ICLK, QCLK)=(0, 1) at all times, there is no possibility that the UP pulse signal or the DOWN pulse signal is outputted, whereas the margin to the duty distortion is limited to the range in which (ICLK, QCLK)=(0, 1), in other words, 90 degrees (that is, ±45 degrees).

Figure 21:
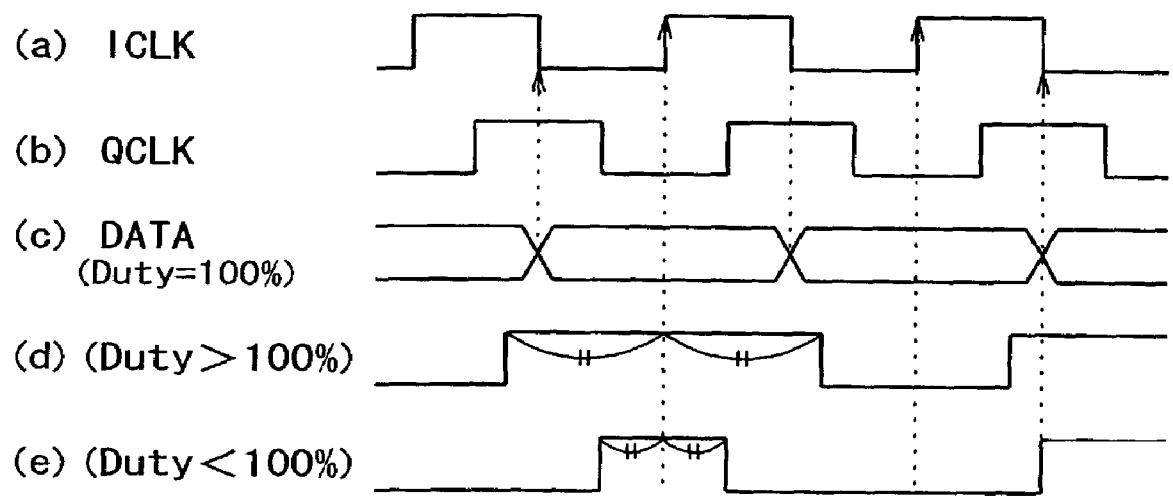
FIG. 21 is a timing chart showing a timing relation provided in a phase locked state of the PLL circuit in the related art.

In either case where the Duty>100% or the Duty<100%, the center of the eye pattern of the input signal DATA is set at the point of time on the leading edge of the clock signal I'CLK. Thus, even if the pulse width of the input signal DATA is varied depending on the duty distortion, the duty ratio variation range in which the sampled value of (ICLK, QCLK)=(0, 1) may be kept becomes greater, in comparison with the related art having been configured to sample the values close to those on the leading edge of the clock signal ICLK at the change point of the input signal DATA, as shown in FIG. 21. As a result, the frequency detection circuit 12 is supposed to sample the clock signals ICLK and QCLK synchronously with the input signal DATA, thereby providing a wider duty ratio variation range in which the constant sampled values thereof are provided.

As described above, in the PLL circuit 10 (10') having the phase detection circuit 11 and the frequency detection circuit 12, the frequency detection circuit 12 is configured to sample the clock signals ICLK and QCLK only on the leading edge (or the trailing edge) of the serially input signal DATA. Thus, when the coincidence in frequency between the input signal DATA and each of the clock signals ICLK and QCLK is provided, combinations of the sampled values of the clock signals ICLK and QCLK become equal at all times, regardless of the duty ratio variations of the input signal DATA, thereby eliminating the generation of the wrong control signal (the UP pulse signal and the DOWN pulse signal). As a result, the stable PLL operation may be provided.

In addition, the pulse generator 17 is configured to generate, on the basis of the oscillation frequency clock VCO-CLK of the VCO 16, the clock signal I'CLK whose phase is delayed by the optional phase limited to the range from more than 180 degrees to less than 270 degrees, preferably 225 degrees, for instance, to the clock signal ICLK, thereby supplying the clock signal I'CLK, together with the input signal DATA, to the phase detection circuit 11. This allows the phase detection circuit 11 to provide the phase control such that the point of time on the leading edge of the clock signal I'CLK may be set at the center of the pulse waveform (the "H" level period, for instance) of the input signal DATA.

This provides the increased phase-control proof (the stable range) to the meta-sable state produced at the time when the duty ratio of the input signal DATA is varied, in the case of sampling (ICLK, QCLK)=(0, 1), for instance, in the frequency detection circuit 12 at the point close to the point of the phase locking to the specific frequency. Thus, advantages may be provided of reducing a converging time required for the frequency detection in the frequency detection circuit 12, and also reducing the malfunctions to the control signal of the frequency detection circuit 12, regardless the duty ratio variations of the input signal DATA. As a result, the malfunctions of the frequency detection circuit 12 constituting the PLL circuit 10 (10') are eliminated, and the operation of the PLL circuit may be proportionally stabilized as a whole.

Incidentally, the above embodiment is configured such that the frequency detection circuit 12 is used to sample the pattern of (ICLK, QCLK)=(0, 1) out of four kinds of combination patterns (0, 0), (0, 1), (1,0), (1,1) of the logic levels of the clock signals ICLK and QCLK, and the phase of the clock signal I'CLK is delayed by the phase limited to the range from more than 180 degrees to less than 270 degrees, preferably 225 degrees, for instance, to the clock signal ICLK under the requirements thereof, thereby providing the point of time on the leading edge of the input signal DATA (Duty=100%) so as to be at the center of (ICLK, QCLK)=(1,0), and also setting the margin to the duty distortion so as to be limited to the range of 270 degrees. However, it is to be understood that the above embodiment is only one instance among many, and the present invention is not limited to the above embodiment.

In other words, the present invention may also provide the same operations and effects as those in the above embodiment by setting the phase relation between the clock signals ICLK and I'CLK so as to delay the phase of the clock signal I'CLK by the phase limited to the range from more than 0 degree to less than 90 degrees, preferably 45 degrees to the clock signal ICLK when the frequency detection circuit 12 is configured to sample the pattern of (ICLK, QCLK)=(1,0), or delay the phase of the clock signal I'CLK by the phase limited to the range from more than 90 degrees to less than 180 degrees, preferably 135 degrees to the clock signal ICLK when the phase detection circuit 12 is configured to sample the pattern of (ICLK, QCLK)=(1,1), or delay the phase of the clock signal I'CLK by the phase limited to the range from more than 270 degrees to less than 360 degrees, preferably 315 degrees to the clock signal ICLK when the phase detection circuit 12 is configured to sample the pattern of (ICLK, QCLK)=(0,0).

In addition, the above embodiment has been described by taking a case where the PLL circuit having the frequency detection circuit 12 configured to sample the clock signals ICLK and QCLK only on one of the leading and trailing edges of the serially input signal DATA is configured such that the clock signal I'CLK whose phase is delayed by 225 degrees, for instance, to the clock signal ICLK is supplied, together with the input signal DATA, to the phase detection circuit 11. However, it is to be understood that the present invention is not limited to the above embodiment and is also applicable to a PLL circuit having the frequency detection circuit according to the related art configured to sample the clock signals ICLK and QCLK on both the leading and trailing edges of the serially input signal DATA.

Figure 13:
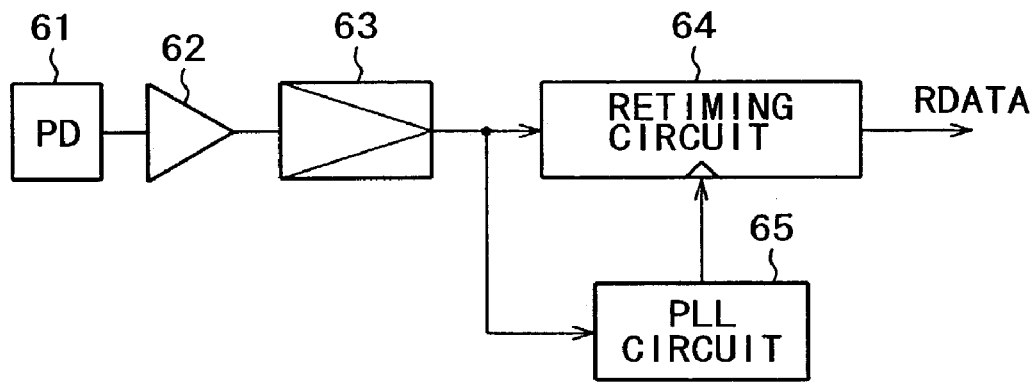
FIG. 13 is a block diagram showing a configuration of an essential part of an optical communications receiving apparatus according to the present invention.
Figure 14:
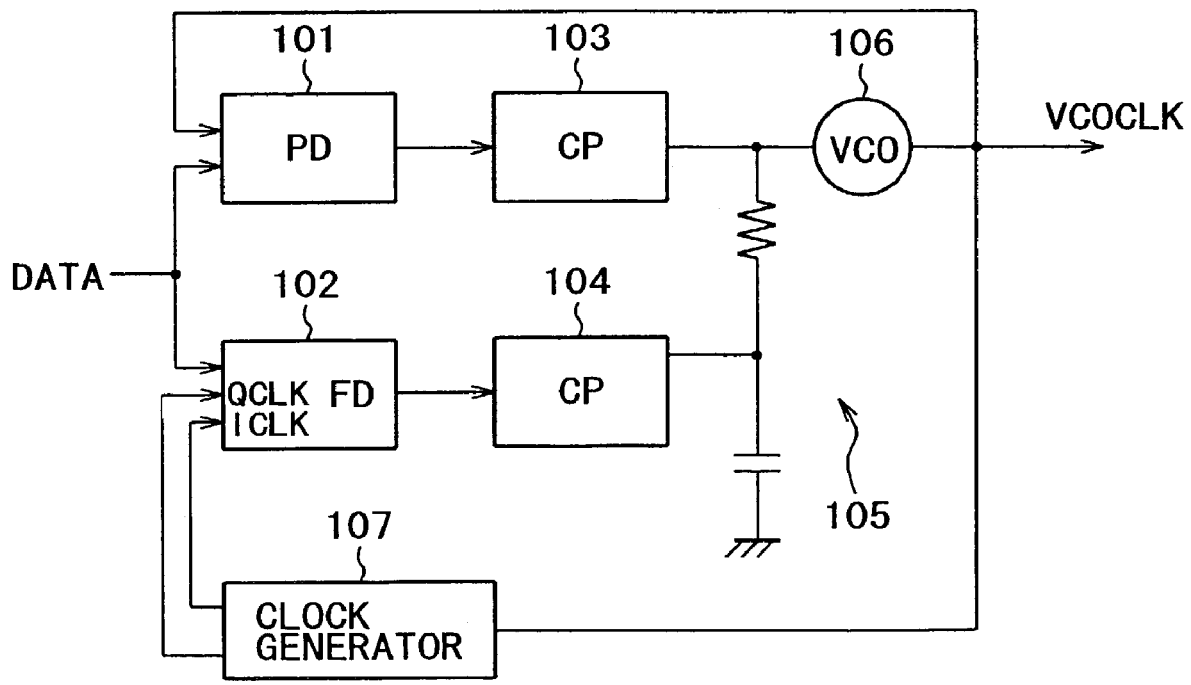
FIG. 14 is a block diagram showing a basic configuration of a PLL circuit in a related art.
Figure 15:
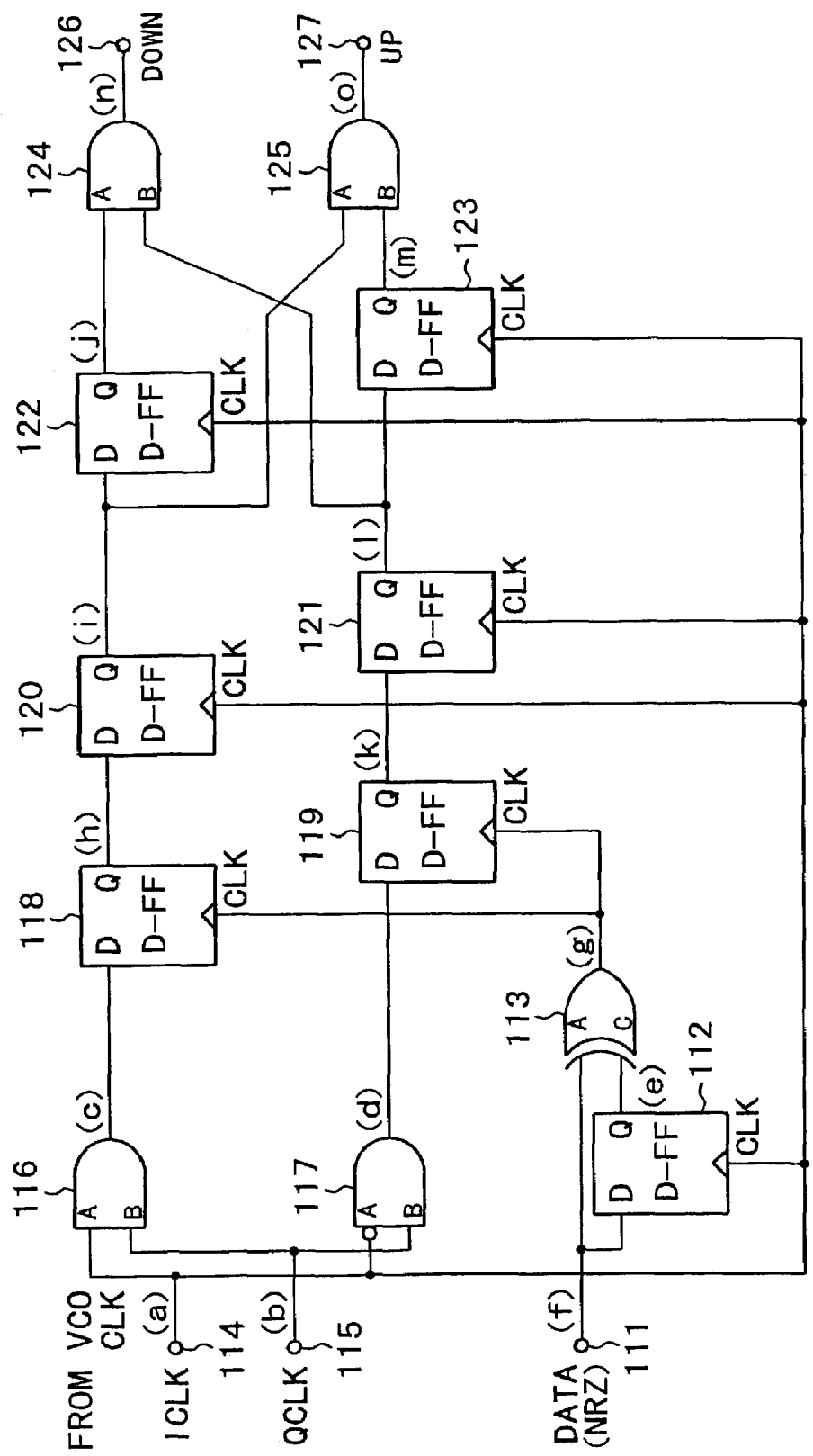
FIG. 15 is a block diagram showing a frequency detection circuit of the PLL circuit in the related art.
Figure 16:
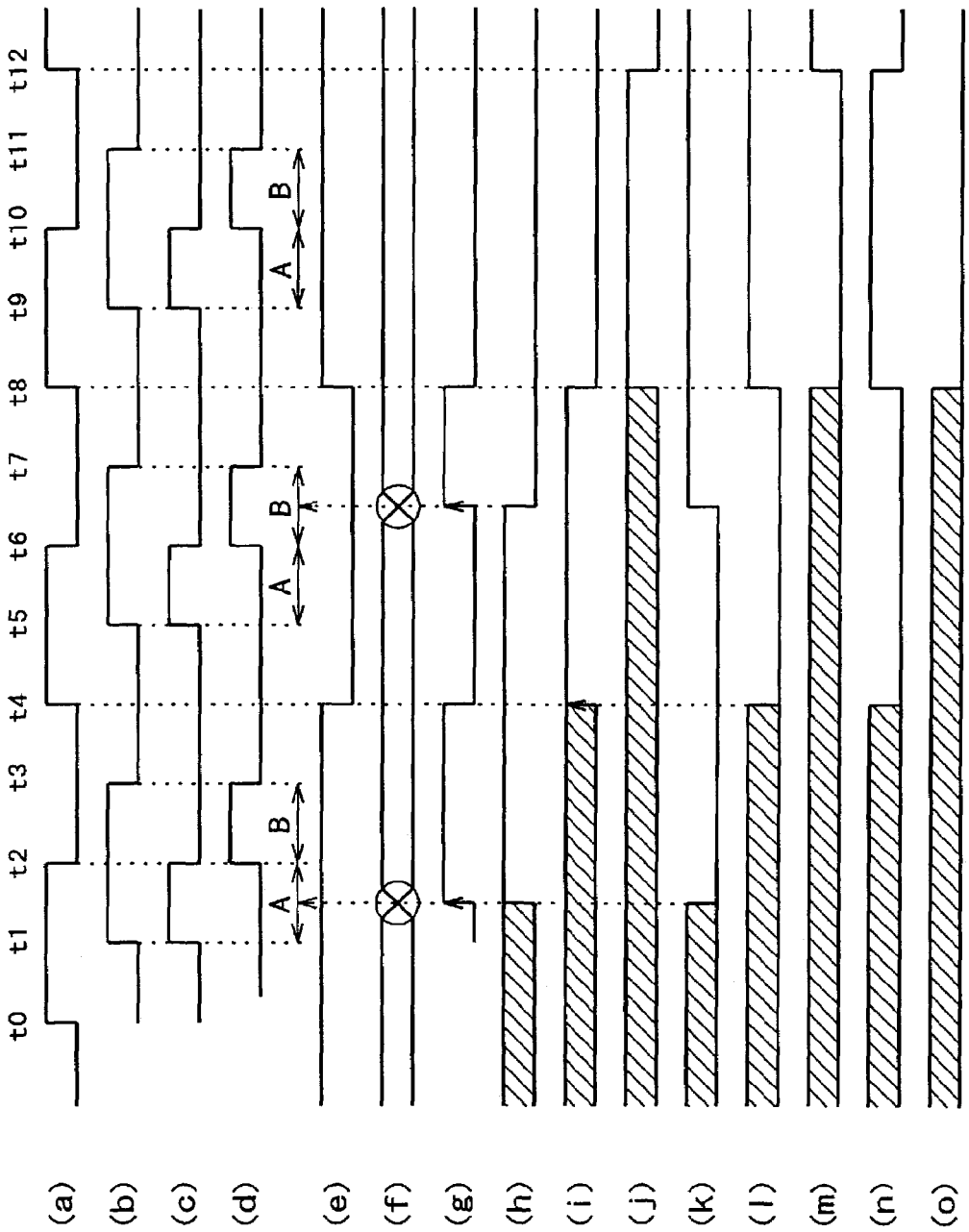
FIG. 16 is a timing chart for illustrating a circuit operation of the frequency detection circuit of the PLL circuit in the related art.
Figure 17:
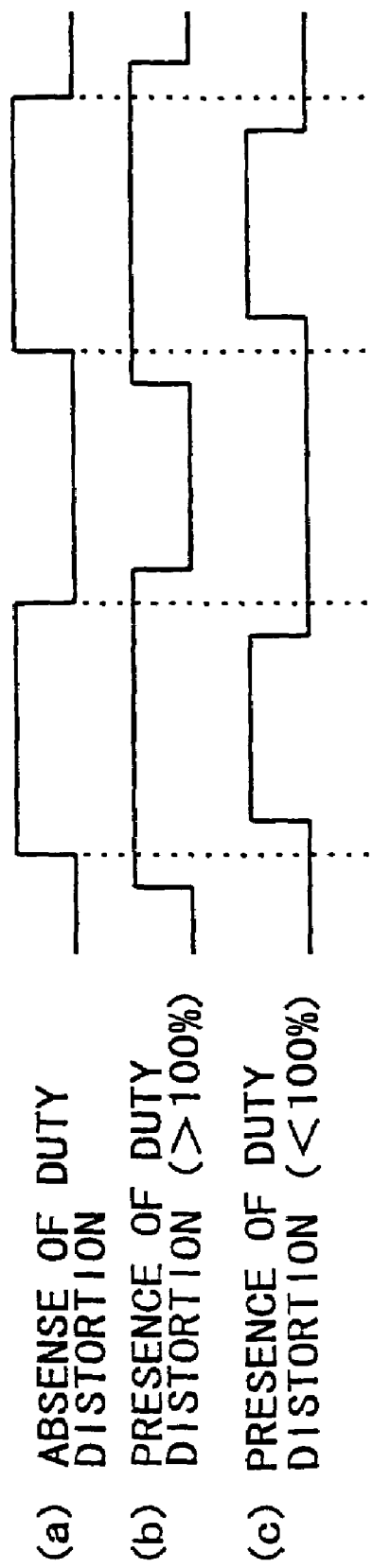
FIG. 17 is a waveform diagram showing the input signal DATA in the presence of a duty distortion and that in the absence thereof.
Figure 18:
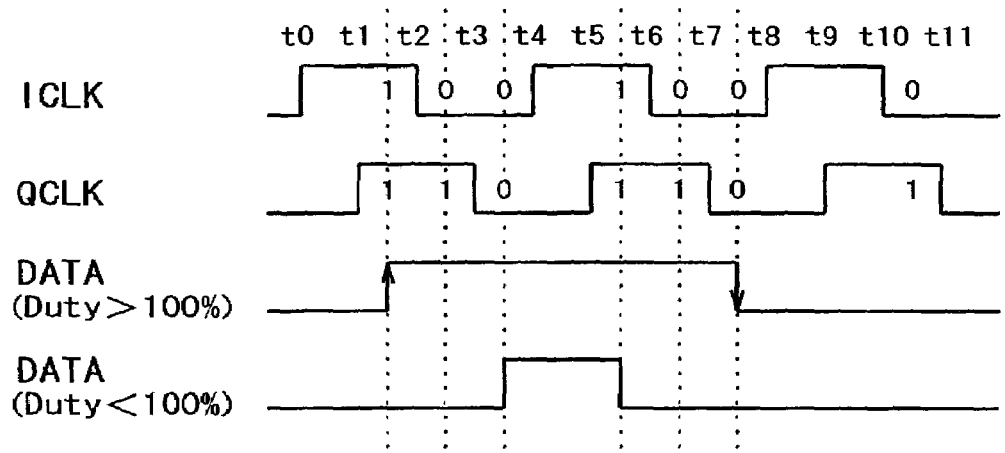
FIG. 18 is a timing chart for illustrating a circuit operation of the frequency detection circuit of the PLL circuit in the related art in the presence of the duty distortion in the input signal DATA.
Figure 19:
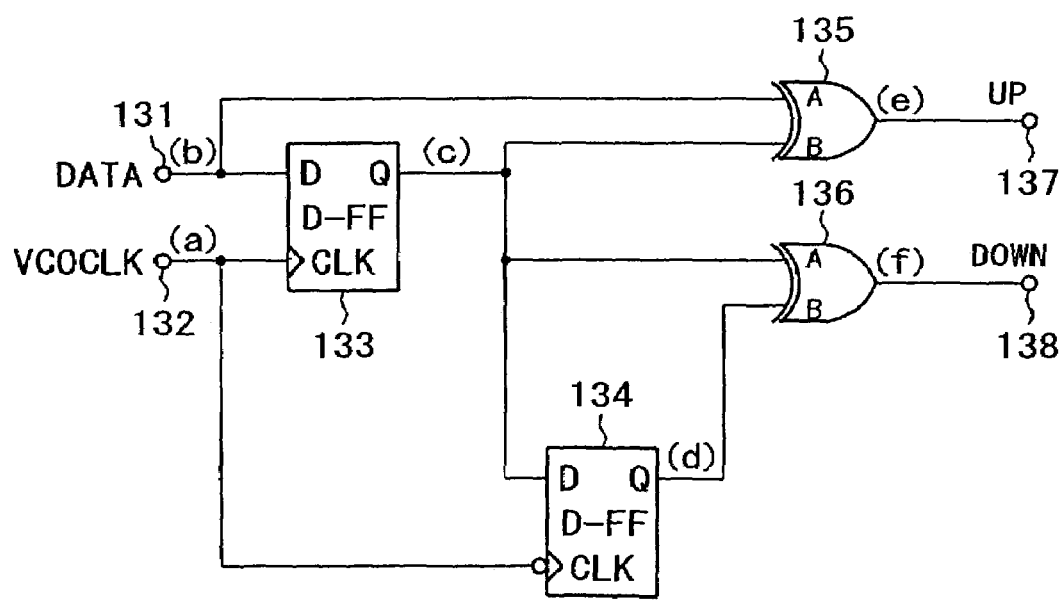
FIG. 19 is a block diagram showing a phase detection circuit of the PLL circuit in the related art.
Figure 20:
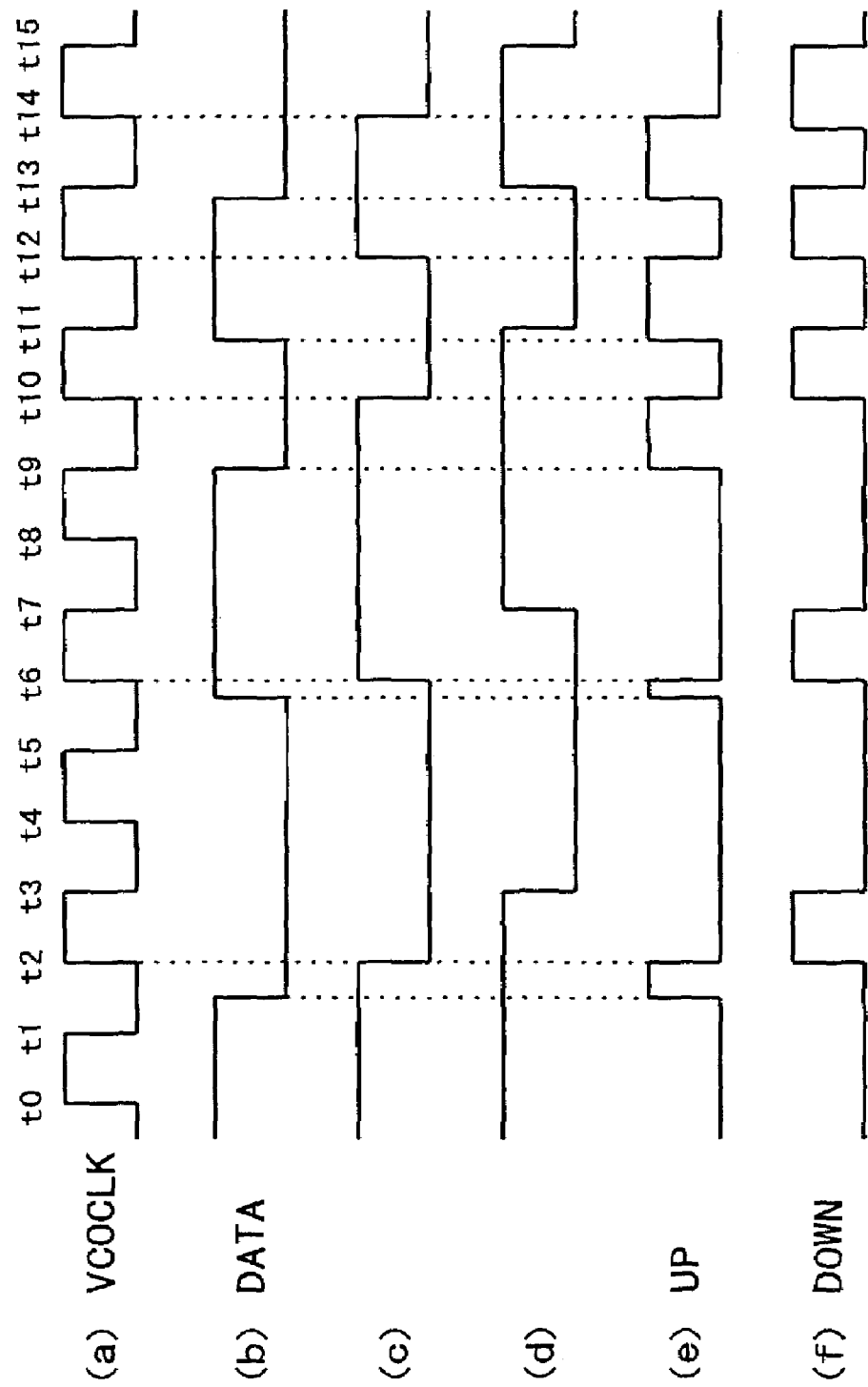
FIG. 20 is a timing chart for explaining a circuit operation of the phase detection circuit of the PLL circuit in the related art.

FIG. 13 is a block diagram showing a configuration of an optical communications receiving apparatus according to the present invention. In FIG. 13, an optical signal is received with a photo detector (PD) 61 and is therein converted into an electrical signal, which is then outputted as a signal current. The signal current is converted into a signal voltage in an I (current) to V (voltage) conversion circuit 62, and is then amplified with an amplifier 63, thereby being supplied to a retiming circuit 64 and a PLL circuit 65.

The PLL circuit 65 is provided to extract a clock component from receiving data supplied from the amplifier 63, thereby generating a new clock signal phase-locked to the extracted clock component so as to be supplied to the re-timing circuit 64. The PLL circuit 10 (10') according to the above embodiment is used as the PLL circuit 65. The re-timing circuit 64 outputs the receiving data supplied from the amplifier 63 after being subjected to re-timing (a kind of waveform shaping) on the basis of the clock signal provided from the PLL circuit 65.

As described above, when the PLL circuit according to the above embodiment is used as the PLL circuit 65 of the receiving apparatus in optical communications using NRZ digital data, for instance, the converging time required for the frequency detection in the frequency detection circuit may be reduced, and the malfunctions to the control signal of the frequency detection circuit hardly take place to provide the stable PLL operation, regardless of the duty ratio variations of the input signal. Thus, the PLL circuit produces no malfunction to the data of the transmitting signal, which is supposed to easily cause the duty distortion, thereby providing a more stable re-timing process in the re-timing circuit 64.

Incidentally, although the present invention has been described by taking a case where the PLL circuit is applied to the receiving apparatus in optical communications, it is to be understood that the present invention is not limited to the above embodiment, and is also applicable to the general processing system particularly required for the processing of data, which is supposed to easily cause duty distortion.

What is claimed is:

1. A phase locked loop circuit, comprising:
a variable frequency oscillator;
a signal generation circuit for generating, on the basis of an oscillation frequency signal of said oscillator, a first signal having the same phase as said oscillation frequency signal has, a second signal having a phase delayed by a first phase amount relative to the phase of said first signal and a third signal having a phase delayed by a second phase amount relative to the phase of said first signal, said second phase amount being larger than said first phase amount;
a phase detection circuit for comparing the phase of said third signal generated in said signal generation circuit with a phase of an input signal, and outputting one of a first phase control signal to advance the phase of the oscillation frequency signal from said variable frequency oscillator and a second phase control signal to delay the phase of the oscillation frequency signal on the basis of the result of comparison; and
a frequency detection circuit for sampling said first and second signals generated in said signal generation circuit in synchronism with said input signal, and outputting one of a first frequency control signal to set a frequency of the oscillation frequency signal of said variable frequency oscillator higher and a second frequency control signal to set the frequency of said variable frequency oscillator lower, when a combination of logic values of sampled two signals is of a specific pattern; wherein
said signal generation circuit is configured to set said second phase amount at a phase amount that makes a change point of said third signal be positioned within said specific pattern.

2. The phase locked loop circuit according to claim 1, wherein
said first, second and third signals are clock signals.

3. The phase locked loop circuit according to claim 1, wherein
said second phase amount is 225 degrees.

4. The phase locked loop circuit according to claim 1, wherein
said second phase amount is limited to a first range from more than 90 degrees to less than 180 degrees when said specific pattern is (1, 1), a second range from more than 180 degrees to less than 270 degrees when said specific pattern is (0, 1), and a third range from more than 270 degrees to less than 360 degrees when said specific pattern is (0,0).

5. The phase locked loop circuit according to claim 4, wherein
said second phase amount is 135 degrees when said specific pattern is (1, 1), said second phase amount is 225 degrees when said specific pattern is (0, 1), and said second phase amount is 315 degrees when said specific pattern is (0,0).

6. The phase locked loop circuit according to claim 1, wherein
said frequency detection circuit is configured to sample said first and second signals in synchronism with said input signal at every period, while performing a logical operation of the sampled signal with the sampled signal sampled at a period ahead by one period, and outputting one of the first frequency control signal to set the frequency of the oscillation frequency signal of said oscillator higher and the second frequency control signal to set the frequency thereof lower on the basis of the result of logic operation.

7. The phase locked loop circuit according to claim 6, wherein
said frequency detection circuit is composed of:
a first sampling circuit for sampling said first signal in synchronism with said input signal at every period;
a second sampling circuit for sampling said second signal in synchronism with said input signal at every period; and
a control logic circuit for holding the signals sampled with said first and second sampling circuits, while performing a logic operation of the held signals with signals to be sampled next with said first and second sampling circuits, and generating one of said first frequency control signal and said second frequency control signal on the basis of the result of the logic operation.

8. The phase locked loop circuit according to claim 7, wherein
said control logic circuit is composed of:
a first logic operation circuit for performing a logic operation of output signals of said first and second sampling circuits;
a first storage circuit for storing an output signal of said first logic operation circuit;
a second logic operation circuit for performing a logic operation of the output signals of said first and second sampling circuits with a stored signal in said first storage circuit;
a third logic operation circuit for performing a logic operation of a signal provided by subjecting the output signals of said first and second sampling circuits to the logic processing with the stored signal in said first storage circuit;
a second storage circuit for storing an output signal of said second logic operation circuit; and
a third storage circuit for storing an output signal of said third logic operation circuit.

9. The phase locked loop circuit according to claim 7, wherein
said first and second sampling circuits are configured to respectively sample said first and second signals at the point of time on one of the leading and trailing edge of said input signal.

10. The phase locked loop circuit according to claim 7, wherein
each of said first and second sampling circuits is configured by a flip-flop circuit.

11. The phase locked loop circuit according to claim 10, wherein
said flip-flop circuit is a D type flip-flop circuit.

12. The phase locked loop circuit according to claim 11, wherein
said D type flip-flop circuit is configured to sample said first and second signals at the point of time of the leading edge of clock input.

13. The phase locked loop circuit according to claim 8, wherein
each of said first, second and third logic operation circuits is configured by an OR circuit.

14. The phase locked loop circuit according to claim 8, wherein
each of said first, second and third storage circuits is configured by a flip-flop circuit.

15. The phase locked loop circuit according to claim 14, wherein
said flip-flop circuit is a D type flip-flop circuit.

16. An optical communications receiving apparatus, comprising:
light receiving means for outputting an output signal obtained by converting a received optical signal into an electric signal;
a PLL circuit for generating a clock signal synchronized with the output signal of said light receiving means; and
a re-timing circuit for providing a re-timing processing to the output signal of said light receiving means on the basis of the clock signal generated in said PLL circuit; wherein said PLL circuit comprises:
a variable frequency oscillator;
a signal generation circuit for generating, on the basis of an oscillation frequency signal of said oscillator, a first signal having the same phase as said oscillation frequency signal has, a second signal having a phase delayed by a first phase amount relative to the phase of said first signal, and a third signal having a phase delayed by a second phase amount relative to the phase of said first signal, said second phase amount being larger than said first phase amount;
a phase detection circuit for comparing the phase of said third signal generated in said signal generation circuit with a phase of an input signal, and outputting one of a first phase control signal to advance the phase of the oscillation frequency signal from said variable frequency oscillator and a second phase control signal to delay the phase of the oscillation frequency signal on the basis of the result of comparison; and
a frequency detection circuit for sampling said first and second signals generated in said signal generation circuit in synchronism with said input signal, and outputting one of a first frequency control signal to set a frequency of the oscillation frequency signal of said variable frequency oscillator higher and a second frequency control signal to set the frequency of said variable frequency oscillator lower, when a combination of logic values of sampled two signals is of a specific pattern; wherein
said signal generation circuit is configured to set said second phase amount at a phase amount that makes a change point of said third signal be positioned within said specific pattern.

17. The optical communications receiving apparatus according to claim 16, wherein
said first, second and third signals are clock signals.

18. The optical communications receiving apparatus according to claim 16, wherein
said second phase amount is 225 degrees.

19. The optical communications receiving apparatus according to claim 16, wherein
said second phase amount is limited to a first range from more than 90 degrees to less than 180 degrees when said specific pattern is (1, 1), a second range from more than 180 degrees to less than 270 degrees when said specific pattern is (0, 1), and a third range from more than 270 degrees to less than 360 degrees when said specific pattern is (0,0).

20. The optical communications receiving apparatus according to claim 19, wherein
said second phase amount is 135 degrees when said specific pattern is (1, 1), said second phase amount is 225 degrees when said specific pattern is (0, 1), and said second phase amount is 315 degrees when said specific pattern is (0,0).

21. The optical communications receiving apparatus according to claim 16, wherein
said frequency detection circuit is configured to sample said first and second signals in synchronism with said input signal at every period, while performing a logical operation of the sampled signal with the sampled signal sampled at a period ahead by one period, and outputting one of the first frequency control signal to set the frequency of the oscillation frequency signal of said oscillator higher and the second frequency control signal to set the frequency thereof lower on the basis of the result of logic operation.

22. The optical communications receiving apparatus according to claim 21, wherein said frequency detection circuit is composed of:

a first sampling circuit for sampling said first signal in synchronism with said input signal at every period;

a second sampling circuit for sampling said second signal in synchronism with said input signal at every period; and a control logic circuit for holding the signals sampled with said first and second sampling circuits, while performing a logic operation of the held signals with signals to be sampled next with said first and second sampling circuits, and generating one of said first frequency control signal and said second frequency control signal on the basis of the result of the logic operation.

23. The optical communications receiving apparatus according to claim 22, wherein said control logic circuit is composed of:

a first logic operation circuit for performing a logic operation of output signals of said first and second sampling circuits;

a first storage circuit for storing an output signal of said first logic operation circuit;

a second logic operation circuit for performing a logic operation of the output signals of said first and second sampling circuits with a stored signal in said first storage circuit;

a third logic operation circuit for performing a logic operation of a signal provided by subjecting the output signals of said first and second sampling circuits to the logic processing with the stored signal in said first storage circuit;

a second storage circuit for storing an output signal of said second logic operation circuit; and a third storage circuit for storing an output signal of said third logic operation circuit.

24. The optical communications receiving apparatus according to claim 22, wherein said first and second sampling circuits are configured to respectively sample said first and second signals at the point of time on one of the leading and trailing edge of said input signal.

* * * * *